(12) United States Patent
Li

(10) Patent No.: US 10,658,511 B2
(45) Date of Patent: May 19, 2020

(54) SEMICONDUCTOR DEVICE AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 16/044,818

(22) Filed: Jul. 25, 2018

(65) Prior Publication Data
US 2019/0035925 A1 Jan. 31, 2019

(30) Foreign Application Priority Data

Jul. 26, 2017 (CN) .......................... 2017 1 0615546

(51) Int. Cl.
*H01L 29/78* (2006.01)
*H01L 23/532* (2006.01)
(Continued)

(52) U.S. Cl.
CPC ............ *H01L 29/785* (2013.01); *H01L 21/28* (2013.01); *H01L 21/3212* (2013.01);
(Continued)

(58) Field of Classification Search
None
See application file for complete search history.

(56) References Cited

U.S. PATENT DOCUMENTS 9,059,002 B2 * 6/2015 He .................... H01L 29/045
9,136,383 B2 * 9/2015 Wann ............... H01L 29/41791
(Continued)

FOREIGN PATENT DOCUMENTS

CN 103871856 A 6/2014
CN 104733312 A 6/2015

*Primary Examiner* — Chandra Chaudhari
(74) *Attorney, Agent, or Firm* — Brinks Gilson & Lione

(57) ABSTRACT

The present disclosure is directed to a semiconductor device and a manufacturing method therefor. In one implementations, a method includes: providing a semiconductor structure, where the semiconductor structure includes: a substrate, and a first fin and a second fin spaced on the substrate; depositing a first interlayer dielectric layer on the semiconductor structure; performing first partial etching on the first interlayer dielectric layer to expose a top of the first fin; after the top of the first fin is exposed, removing a part of the first fin to form a first groove; epitaxially growing a first electrode in the first groove; performing second partial etching on the first interlayer dielectric layer to expose a top of the second fin; after the top of the second fin is exposed, removing a part of the second fin to form a second groove, where the second groove is separated from the first groove; and epitaxially growing a second electrode in the second groove. The present disclosure addresses the problem of bridging of electrode epitaxial bodies of different devices in the prior art.

20 Claims, 17 Drawing Sheets

(51) Int. Cl.
  *H01L 29/66* (2006.01)
  *H01L 21/28* (2006.01)
  *H01L 21/477* (2006.01)
  *H01L 21/8238* (2006.01)
  *H01L 21/321* (2006.01)
  *H01L 27/092* (2006.01)

(52) U.S. Cl.
  CPC .... *H01L 21/477* (2013.01); *H01L 21/823821* (2013.01); *H01L 23/5329* (2013.01); *H01L 27/0924* (2013.01); *H01L 29/66795* (2013.01)

(56) References Cited

U.S. PATENT DOCUMENTS

2016/0343848 A1 11/2016 Bartels
2017/0221907 A1* 8/2017 Hsieh .................. H01L 27/0886

\* cited by examiner

SEMICONDUCTOR DEVICE AND MANUFACTURING METHOD THEREFOR

RELATED APPLICATIONS

The present application claims priority to Chinese Patent Appln. No. 201710615546.1, filed Jul. 26, 2017, the entire disclosure of which is hereby incorporated by reference.

BACKGROUND

Technical Field

The present disclosure relates to the field of semiconductor technologies, and in particular, to a semiconductor device and a manufacturing method therefor.

Related Art

Generally, in a P-channel metal oxide semiconductor (PMOS) device, silicon-germanium (SiGe) epitaxial bodies (as a source and a drain) improve a hole mobility and reduce a contact resistance, and can thereby improve a performance of the PMOS device. In an N-channel metal oxide semiconductor (NMOS) device, silicon phosphide (SiP) epitaxial bodies (as a source and a drain) can reduce a contact resistance by increasing a contact area of a source area or a drain area and thereby improve the performance of the NMOS device. However, if the epitaxial bodies of the PMOS and the NMOS grow excessively large, the epitaxial bodies of the two devices may be connected. Consequently, a source voltage Vdd connected to the epitaxial bodies of the PMOS device and a circuit common ground voltage Vss connected to the epitaxial bodies of the NMOS device may be bridged, resulting in a circuit failure.

FIG. 1 is a diagram schematically showing a circuit layout of a static random access memory (SRAM) in the prior art. FIG. 1 shows a grid contactor 101, an active area (for example, a source or a drain) contactor 102, and an active area 103. The SRAM includes six transistors, which are respectively pass gate (PG) transistors 11 and 14, pull down (PD) transistors 12 and 15, and pull up (PU) transistors 13 and 16. The PG transistors and the PD transistors are NMOS transistor devices and active area contactors thereof are connected to Vss, and the PU transistors are PMOS transistor devices and active area contactors thereof are connected to Vdd. If sources and drains (that is, the epitaxial bodies described above) of the PMOS transistors and the NMOS transistors grow excessively large, the sources/drains of the PMOS transistors and the sources/drains of the NMOS transistors may be connected. That is, the Vdd and the Vss may be bridged. Currently, these PMOS transistors and NMOS transistors may be fin field-effect transistor (FinFET) devices. With the gradual decrease in the size of a fin, space between SiP epitaxial bodies and SiGe epitaxial bodies becomes smaller, and the problem of bridging of the Vdd to the Vss becomes worse.

Although in the current manufacturing processes, if the SiP epitaxial bodies and the SiGe epitaxial bodies grow excessively large, the problem of bridging of the Vdd and the Vss may occur, if the sizes of the SiGe epitaxial bodies are reduced, a stress of the SiGe epitaxial bodies on a channel region decreases, and a hole mobility is reduced, and because a contact area decreases, a contact resistance increases. If the sizes of the SiP epitaxial bodies are reduced, a contact resistance increases due to a decrease in a contact area. However, for a logic device, a larger size of an epitaxial body is preferred.

In addition, with a further decrease in the size of a device, the areas of a source area and a drain area may not be sufficiently large, usually resulting in merging of epitaxial bodies of the source and the drain. In addition to the problem of bridging of the Vdd and the Vss, this may also prevent a contact etch stop layer (CESL) from continuously covering a gap between two source/drain epitaxial bodies. Consequently, subsequent gap filling of an interlayer dielectric layer may become a problem. For example, if there exists a gap in the CESL layer or the interlayer dielectric layer, in the process of forming a contactor, after a contact hole is opened, a tungsten material for forming the contactor may fill the gap, causing that the contactor and a neighboring epitaxial body may be bridged. Therefore, for an NMOS device and a PMOS device, a source/drain epitaxial body with a relatively small size is needed. However, on the other hand, an epitaxial body with a possibly largest size is needed to reduce a contact resistance. Therefore, these become contradictory problems that urgently need to be resolved.

SUMMARY

The inventor of the present disclosure finds that problems exist in the prior art, and proposes a new technical solution to at least one of the problems.

In a first aspect of the present disclosure, a manufacturing method for a semiconductor device is provided, including: providing a semiconductor structure, where the semiconductor structure includes: a substrate, and a first fin and a second fin spaced on the substrate; depositing a first interlayer dielectric layer on the semiconductor structure; performing first partial etching on the first interlayer dielectric layer to expose a top of the first fin; after the top of the first fin is exposed, removing a part of the first fin to form a first groove; epitaxially growing a first electrode in the first groove; performing second partial etching on the first interlayer dielectric layer to expose a top of the second fin; after the top of the second fin is exposed, removing a part of the second fin to form a second groove, where the second groove is separated from the first groove; and epitaxially growing a second electrode in the second groove.

In some implementations, before epitaxially growing the first electrode, the method further includes: performing enlargement treatment on the first groove; the step of epitaxially growing a first electrode in the first groove includes: epitaxially growing the first electrode in the first groove on which enlargement treatment has been performed; before epitaxially growing the second electrode, the method further includes: performing enlargement treatment on the second groove, where the second groove on which enlargement treatment has been performed is separated from the first electrode; and the step of epitaxially growing a second electrode in the second groove includes: epitaxially growing the second electrode in the second groove on which enlargement treatment has been performed.

In some implementations, in the step of providing a semiconductor structure, the semiconductor structure further includes: a trench around the first fin and the second fin; a trench insulator layer partially filling the trench; and a separating coverage layer covering the first fin, the second fin, and the trench insulator layer, where the first interlayer dielectric layer is formed on the separating coverage layer.

In some implementations, the step of performing first partial etching on the first interlayer dielectric layer to expose a top of the first fin includes: performing first partial etching on the first interlayer dielectric layer using the separating coverage layer as an etch stop layer, to expose a part of the separating coverage layer on the top of the first fin; and removing the exposed part of the separating coverage layer on the top of the first fin, to expose the top of the first fin; and the step of removing a part of the first fin to form a first groove includes: removing the part of the first fin and a part of the separating coverage layer on a side wall of the removed part of the first fin, to form the first groove.

In some implementations, the method further includes: before performing the second partial etching on the first interlayer dielectric layer, depositing a cover layer on the semiconductor structure on which the first electrode has been epitaxially grown.

In some implementations, the step of performing second partial etching on the first interlayer dielectric layer to expose a top of the second fin includes: performing second partial etching on the first interlayer dielectric layer and the cover layer by using the separating coverage layer as an etch stop layer, to expose a part of the separating coverage layer on the top of the second fin; and removing the exposed part of the separating coverage layer on the top of the second fin, to expose the top of the second fin; and the step of removing a part of the second fin to form a second groove includes: removing the part of the second fin and a part of the separating coverage layer on a side wall of the removed part of the second fin, to form the second groove.

In some implementations, the first fin includes: a first semiconductor fin on the substrate and a first insulator layer on a surface of the first semiconductor fin; the second fin includes: a second semiconductor fin on the substrate and a second insulator layer on a surface of the second semiconductor fin; the first electrode is a first source or a first drain; and the second electrode is a second source or a second drain.

In some implementations, the method further includes: forming a second interlayer dielectric layer on the semiconductor structure on which the second electrode has been epitaxially grown; performing annealing treatment on the semiconductor structure on which the second interlayer dielectric layer has been formed; and performing planarization treatment on the semiconductor structure on which the annealing treatment has been performed.

Above, forms of a manufacturing method for a semiconductor device according the present disclosure are provided. In forms of the manufacturing method, a first interlayer dielectric layer is deposited on a semiconductor structure, then the first interlayer dielectric layer is etched to expose a top of a first fin, a first groove is obtained by removing a part of the first fin, and a first electrode is epitaxially grown in the first groove, and then the first interlayer dielectric layer is etched to expose a top of a second fin, a second groove is obtained by removing a part of the second fin, and a second electrode is epitaxially grown in the second groove. This helps to separate (that is, disconnect) the electrodes on the two fins without reducing the sizes of the electrodes (that is, epitaxial bodies), thereby resolving the problem in the prior art that electrode epitaxial bodies of different devices are connected.

In addition, in forms of the method described above, the first electrode and the second electrode are epitaxially grown after the first interlayer dielectric layer is formed by deposition. That is, the two electrodes have not been epitaxially grown when the first interlayer dielectric layer is deposited. Therefore, a gap between the first electrode and the second electrode is quite easy to be filled, thereby resolving the problem of filling of an interlayer dielectric layer between two electrode epitaxial bodies in the prior art.

In a second aspect of the present disclosure, a manufacturing method for a semiconductor device is provided, including: providing a semiconductor structure, where the semiconductor structure includes: a substrate, a first fin and a second fin spaced on the substrate, and a first electrode on the first fin; depositing a first interlayer dielectric layer on the semiconductor structure; partially etching the first interlayer dielectric layer to expose a top of the second fin; after the top of the second fin is exposed, removing a part of the second fin to form a groove, where the groove is separated from the first electrode; and epitaxially growing a second electrode in the groove.

In some implementations, before epitaxially growing a second electrode, the method further includes: performing enlargement treatment on the groove, where the groove on which enlargement treatment has been performed is separated from the first electrode; and the step of epitaxially growing a second electrode in the groove includes: epitaxially growing the second electrode in the groove on which enlargement treatment has been performed.

In some implementations, in the step of providing a semiconductor structure, the semiconductor structure further includes: a trench around the first fin and the second fin; a trench insulator layer partially filling the trench; and a first separating coverage layer covering the first fin, the second fin, and a part of the trench insulator layer; before the depositing a first interlayer dielectric layer, the method further includes: performing oxidization treatment to form a surface insulator layer on a surface of the first electrode; and forming a second separating coverage layer on the trench insulator layer, the surface insulator layer, and the first separating coverage layer, where the first interlayer dielectric layer is deposited on the second separating coverage layer.

In some implementations, the step of partially etching the first interlayer dielectric layer to expose a top of the second fin includes: partially etching the first interlayer dielectric layer using the second separating coverage layer as an etch stop layer, to expose a part of the second separating coverage layer on the top of the second fin; and removing the exposed part of the second separating coverage layer and an exposed part of the first separating coverage layer that are on the top of the second fin, to expose the top of the second fin; and the step of removing a part of the second fin to form a groove includes: removing the part of the second fin and a part of the first separating coverage layer and a part of the second separating coverage layer that are on a side wall of the removed part of the second fin, to form the groove.

In some implementations, the step of removing the part of the second fin and a part of the first separating coverage layer and a part of the second separating coverage layer that are on a side wall of the removed part of the second fin, to form the groove includes: removing the part of the second fin to expose the part of the first separating coverage layer and the part of the second separating coverage layer that are on the side wall of the removed part of the second fin; forming a top insulator layer on a top of a remaining part of the second fin; and after the top insulator layer is formed, removing the exposed part of the first separating coverage layer and the exposed part of the second separating coverage layer.

In some implementations, the first fin includes: a first semiconductor fin on the substrate and a first insulator layer on a surface of the first semiconductor fin; the second fin includes: a second semiconductor fin on the substrate and a second insulator layer on a surface of the second semiconductor fin; the first electrode is a first source or a first drain; and the second electrode is a second source or a second drain.

In some implementations, the step of providing a semiconductor structure includes: providing an initial structure, where the initial structure includes: the substrate, and the first semiconductor fin and the second semiconductor fin spaced on the substrate; forming the first insulator layer on the surface of the first semiconductor fin and forming the second insulator layer on the surface of the second semiconductor fin; forming, on the first insulator layer, a first pseudo grid surrounding the first semiconductor fin, and forming, on the second insulator layer, a second pseudo grid surrounding the second semiconductor fin; forming the first separating coverage layer on the initial structure on which the first pseudo grid and the second pseudo grid have been formed; etching the first semiconductor fin and the part of the first insulator layer and the part of the first separating coverage layer that are on the first semiconductor fin, to form the groove; and epitaxially growing the first electrode in the groove.

In some implementations, the method further includes: forming a second interlayer dielectric layer on the semiconductor structure on which the second electrode has been epitaxially grown; performing annealing treatment on the semiconductor structure on which the second interlayer dielectric layer has been formed; and performing planarization treatment on the semiconductor structure on which the annealing treatment has been performed.

Above, other forms of a manufacturing method for a semiconductor device are provided. In forms of the manufacturing method, a first interlayer dielectric layer is deposited on a semiconductor structure, then the first interlayer dielectric layer is etched to expose a top of a second fin, a groove is obtained by removing a part of the second fin, and a second electrode is epitaxially grown in the groove. Because the groove is separated from a first electrode by the first interlayer dielectric layer, the second electrode is also separated from the first electrode by the first interlayer dielectric layer. This helps to separate (that is, disconnect) the electrodes on the two fins without reducing the sizes of the electrodes (that is, epitaxial bodies), thereby addressing the problem in the prior art that electrode epitaxial bodies of different devices are connected. In addition, in forms of the foregoing method, the second electrode is epitaxially grown after the first interlayer dielectric layer is formed by deposition. That is, the second electrode has not been epitaxially grown when the first interlayer dielectric layer is deposited. Therefore, a gap between the first electrode and the second electrode is quite easy to be filled, thereby resolving the problem of filling of an interlayer dielectric layer between two electrode epitaxial bodies in the prior art.

In a third aspect of the present disclosure, forms of a manufacturing method for a semiconductor device are provided, including: providing a semiconductor structure, where the semiconductor structure includes: a substrate and a fin on the substrate; depositing a first interlayer dielectric layer on the semiconductor structure; partially etching the first interlayer dielectric layer to expose a top of the fin; after the top of the fin is exposed, removing a part of the fin to form a groove; and epitaxially growing an electrode in the groove.

In some implementations, before epitaxially growing the electrode, the method further includes: performing enlargement treatment on the groove; and the step of epitaxially growing an electrode in the groove includes: epitaxially growing the electrode in the groove on which enlargement treatment has been performed.

In some implementations, in the step of providing a semiconductor structure, the semiconductor structure further includes: a trench around the fin; a trench insulator layer partially filling the trench; and a separating coverage layer covering the fin and the trench insulator layer, where the step of partially etching the first interlayer dielectric layer to expose a top of the fin includes: partially etching the first interlayer dielectric layer using the separating coverage layer as an etch stop layer, to expose a part of the separating coverage layer on the top of the fin; and removing the exposed part of the separating coverage layer on the top of the fin, to expose the top of the fin; and the step of removing a part of the fin to form a groove includes: removing the part of the fin and a part of the separating coverage layer on a side wall of the removed part of the fin, to form the groove.

In some implementations, the fin includes: a semiconductor fin on the substrate and a first insulator layer on a surface of the semiconductor fin; and the electrode is a source or a drain.

In some implementations, the method further includes: forming a second interlayer dielectric layer on the semiconductor structure on which the electrode has been epitaxially grown; performing annealing treatment on the semiconductor structure on which the second interlayer dielectric layer has been formed; and performing planarization treatment on the semiconductor structure on which the annealing treatment has been performed.

Above, other forms of a manufacturing method for a semiconductor device are provided. In forms of the manufacturing method, a first interlayer dielectric layer is deposited on a semiconductor structure, then the first interlayer dielectric layer is etched to expose a top of a fin, a groove is obtained by removing a part of the fin, and an electrode is epitaxially grown in the groove. This method helps to separate the electrode on the fin from another electrode without reducing the size of the electrode (that is, an epitaxial body), thereby addressing the problem in the prior art that electrode epitaxial bodies of different devices are connected.

In a fourth aspect of the present disclosure, a semiconductor device is provided, including: a substrate; a first semiconductor fin and a second semiconductor fin spaced on the substrate; a first interlayer dielectric layer on the substrate and covering the first semiconductor fin and the second semiconductor fin, where a first groove exposing the first semiconductor fin and a second groove exposing the second semiconductor fin are formed on the first interlayer dielectric layer, and the second groove is separated from the first groove; and a first electrode on the first semiconductor fin and epitaxially growing in the first groove, and a second electrode on the second semiconductor fin and epitaxially growing in the second groove.

In some implementations, the semiconductor device further includes: a trench around the first semiconductor fin and the second semiconductor fin; a trench insulator layer partially filling the trench; a separating coverage layer covering the trench insulator layer, where the first interlayer dielectric layer is located on the separating coverage layer; a cover layer on a part of the first interlayer dielectric layer and the first electrode; and a second interlayer dielectric layer on the cover layer and the first interlayer dielectric layer.

In this implementation, other forms of a semiconductor device according to the present disclosure are provided. In the semiconductor device, a first electrode on a first semiconductor fin and a second electrode on a second semiconductor fin are separated by a first interlayer dielectric layer, thereby resolving the problem in the prior art that electrode epitaxial bodies of different devices are connected. Moreover, there is no problem of gap filling in the first interlayer dielectric layer.

In a fifth aspect of the present disclosure, a semiconductor device is provided, including: a substrate; a first semiconductor fin and a second semiconductor fin spaced on the substrate; a first electrode on the first semiconductor fin; a first interlayer dielectric layer on the substrate and covering the first semiconductor fin, the second semiconductor fin, and the first electrode, where a groove exposing the second semiconductor fin is formed on the first interlayer dielectric layer, and the groove is separated from the first electrode; and a second electrode on the second semiconductor fin and epitaxially growing in the groove.

In some implementations, the semiconductor device further includes: a trench around the first semiconductor fin and the second semiconductor fin; a trench insulator layer partially filling the trench; a first separating coverage layer on the first semiconductor fin, the second semiconductor fin, and the trench insulator layer; a surface insulator layer on a surface of the first electrode; a second separating coverage layer on the trench insulator layer, the surface insulator layer, and the first separating coverage layer, where the first interlayer dielectric layer is formed on the second separating coverage layer; and a second interlayer dielectric layer on the first interlayer dielectric layer and the second electrode.

In this implementation, other forms of a semiconductor device according to the present disclosure are provided. In forms of the semiconductor device, a first electrode on a first semiconductor fin and a second electrode on a second semiconductor fin are separated by a first interlayer dielectric layer, thereby addressing the problem in the prior art that electrode epitaxial bodies of different devices are connected. Moreover, there is no problem of gap filling in the first interlayer dielectric layer.

In a sixth aspect of the present disclosure, a semiconductor device is provided, including: a substrate; a semiconductor fin on the substrate; a first interlayer dielectric layer on the substrate and covering the semiconductor fin, where a groove exposing the semiconductor fin is formed on the first interlayer dielectric layer; and an electrode on the semiconductor fin and epitaxially growing in the groove.

In some implementations, the semiconductor device further includes: a trench around the semiconductor fin; a trench insulator layer partially filling the trench; a separating coverage layer covering the trench insulator layer, where the first interlayer dielectric layer is formed on the separating coverage layer; and a second interlayer dielectric layer on the first interlayer dielectric layer and the electrode.

In this implementation, other forms of a semiconductor device according to the present disclosure are provided. In the semiconductor device, an electrode on a semiconductor fin is surrounded by a first interlayer dielectric layer, and thereby can be separated from another electrode. This can address the problem in the prior art that electrode epitaxial bodies of different devices are connected.

Other features and advantages of the present disclosure become clear by virtue of the following detailed descriptions on exemplary embodiments and implementations of the present disclosure with reference to the accompanying drawings.

BRIEF DESCRIPTION OF THE DRAWINGS

The accompanying drawings forming a part of this specification show embodiments and implementations of the present disclosure, and are intended to explain the principles of the present disclosure together with the specification.

The present disclosure can be understood more clearly according to the following detailed descriptions with reference to the accompanying drawings.

DETAILED DESCRIPTION

Figure 1:
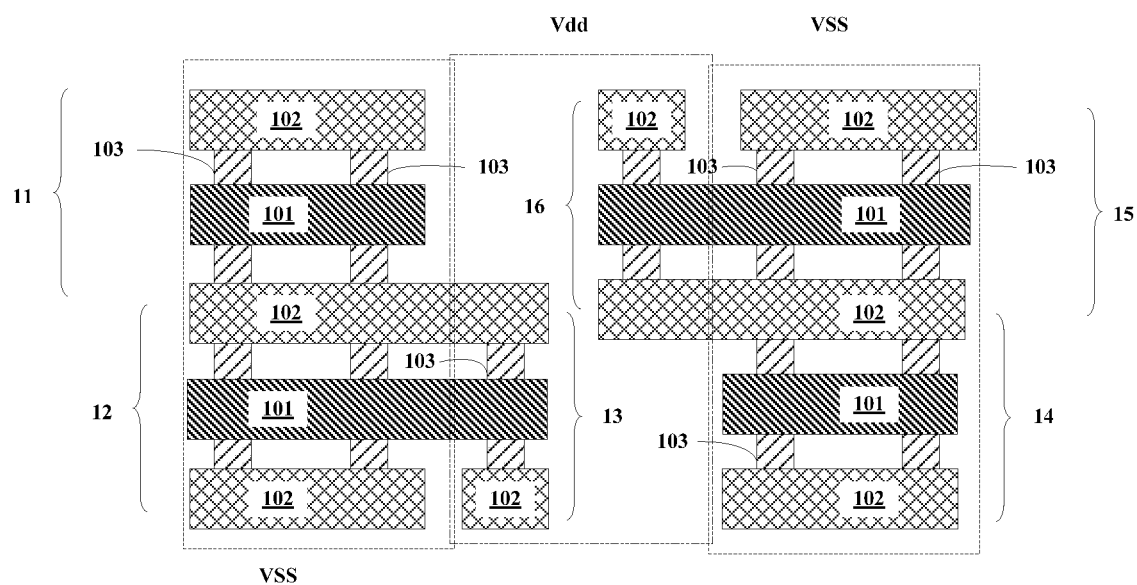
FIG. 1 is a diagram schematically showing a circuit layout of a SRAM in the prior art.

Various exemplary embodiments and implementations of the present disclosure are now described in detail with reference to the accompanying drawings. It should be noted that unless otherwise specifically stated, the relative arrangement, numeric expression, and values of components and steps explained in these embodiments and implementations do not limit the scope of the present invention.

In addition, it should be understood that for ease of description, the sizes of parts shown in the accompanying drawings are not drawn according to actual proportional relationships.

The following description on at least one exemplary embodiment is merely illustrative, and by no means imposes any limitation to the present disclosure and application or use thereof.

Technologies, methods, and devices known by a person of ordinary skill in the art may not be discussed in detail, but when appropriate, the technologies, the methods, and the devices should be considered as a part of this specification.

In all examples shown and discussed herein, any specific value should be interpreted as merely exemplary, rather than limitative. Therefore, other examples of the exemplary embodiments and implementations may have different values.

It should be noted that similar reference numerals and characters represent similar items in the accompanying drawings below. Therefore, once an item is defined in one figure, the item does not need to be further discussed in the subsequent figures.

Figure 2:
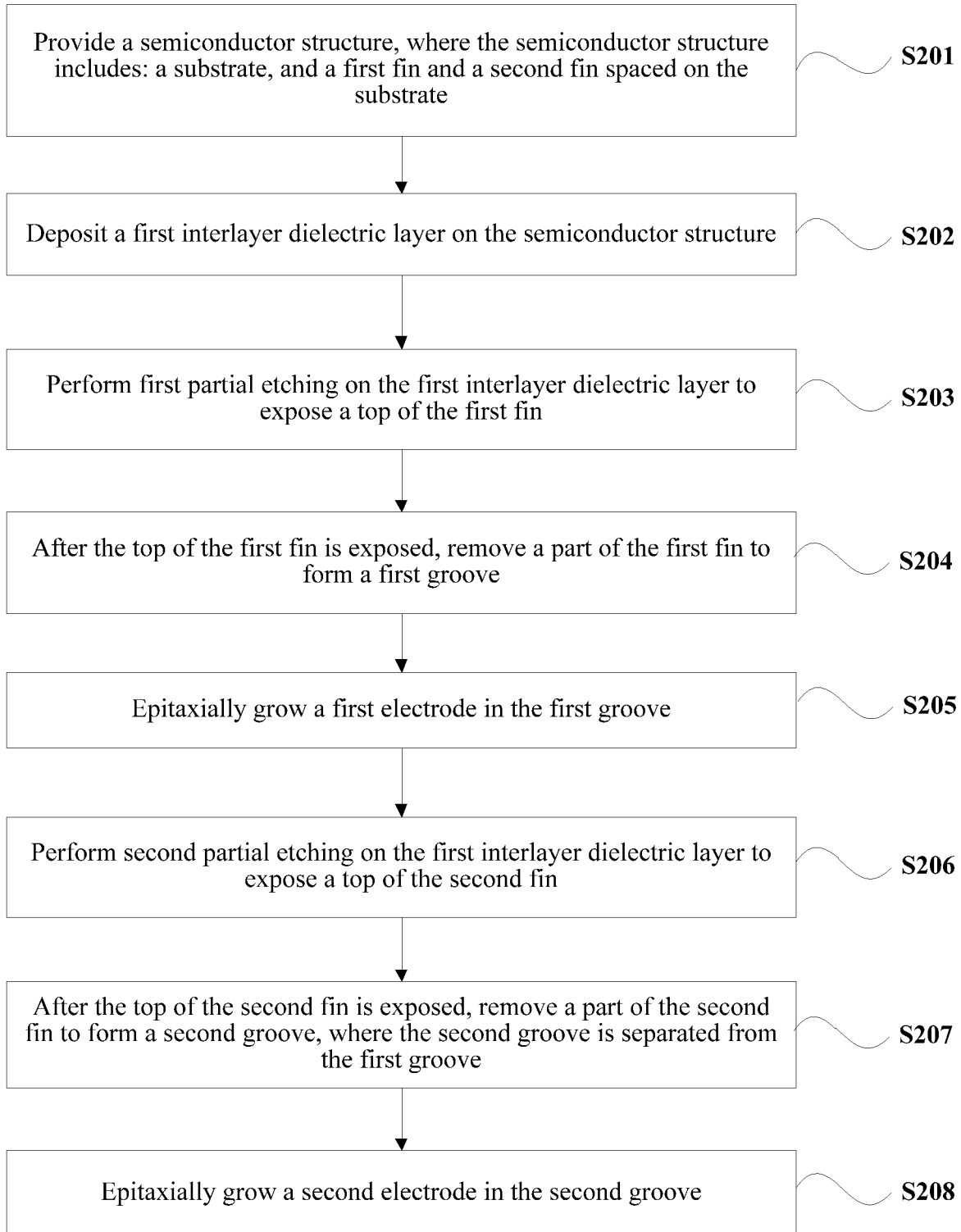
FIG. 2 is a flowchart showing a manufacturing method for a semiconductor device according to one form of the present disclosure.

FIG. 2 is a flowchart showing a manufacturing method for a semiconductor device.

In step S201, a semiconductor structure is provided, where the semiconductor structure includes: a substrate, and a first fin and a second fin spaced on the substrate.

In step S202, a first interlayer dielectric layer is deposited on the semiconductor structure.

In step S203, a first partial etching is performed on the first interlayer dielectric layer to expose a top of the first fin.

In step S204, after the top of the first fin is exposed, a part of the first fin is removed to form a first groove.

In step S205, a first electrode is epitaxially grown in the first groove. For example, the first electrode may include a first source or a first drain.

In step S206, a second partial etching is performed on the first interlayer dielectric layer to expose a top of the second fin.

In step S207, after the top of the second fin is exposed, a part of the second fin is removed to form a second groove, where the second groove is separated from the first groove. For example, the second groove and the first groove are separated by a part of the first interlayer dielectric layer.

In step S208, a second electrode is epitaxially grown in the second groove. For example, the second electrode may include a second source or a second drain.

Above, forms of a manufacturing method for a semiconductor device are provided. In the manufacturing method, a first interlayer dielectric layer is deposited on a semiconductor structure, then the first interlayer dielectric layer is etched to expose a top of a first fin, a first groove is obtained by removing a part of the first fin, and a first electrode is epitaxially grown in the first groove, and then the first interlayer dielectric layer is etched to expose a top of a second fin, a second groove is obtained by removing a part of the second fin, and a second electrode is epitaxially grown in the second groove. This helps to separate (that is, disconnect) the electrodes on the two fins without reducing the sizes of the electrodes (that is, epitaxial bodies), thereby addressing the problem in the prior art that electrode epitaxial bodies of different devices are connected.

Further, when one of the first fin or the second fin is used to form a PMOS transistor and the other is used to form an NMOS transistor, the problem that source/drain epitaxial bodies of the PMOS transistor and the NMOS transistor in a SRAM are connected can be addressed, thereby resolving the problem that Vdd and Vss are bridged.

In addition, in forms of the foregoing method, the first electrode and the second electrode are epitaxially grown after the first interlayer dielectric layer is formed by deposition. That is, the two electrodes have not been epitaxially grown when the first interlayer dielectric layer is deposited. Therefore, it is easy to fill a gap between the first electrode and the second electrode, thereby addressing the problem of filling of an interlayer dielectric layer between two electrode epitaxial bodies in the prior art.

In some implementations, before the first electrode is epitaxially grown, the manufacturing method may further include: performing enlargement treatment on the first groove. The step of epitaxially growing a first electrode in the first groove may include: epitaxially growing the first electrode in the first groove on which enlargement treatment has been performed. This helps to increase the size of the first electrode, and increase a contact area, thereby decreasing a contact resistance. In addition, this can also help to increase a stress of the electrode (as a source or a drain) on a channel, and increase a current carrier mobility, thereby improving the performance of the device.

In some implementations, before the second electrode is epitaxially grown, the manufacturing method may further include: performing enlargement treatment on the second groove, where the second groove on which enlargement treatment has been performed is separated from the first electrode. The step of epitaxially growing a second electrode in the second groove may include: epitaxially growing the second electrode in the second groove on which enlargement treatment has been performed. This helps to increase the size of the second electrode, and increase a contact area, thereby decreasing a contact resistance. In addition, this can also help to increase a stress of the electrode (as a source or a drain) on a channel, and increase a current carrier mobility, thereby improving the performance of the device.

Figure 3A:
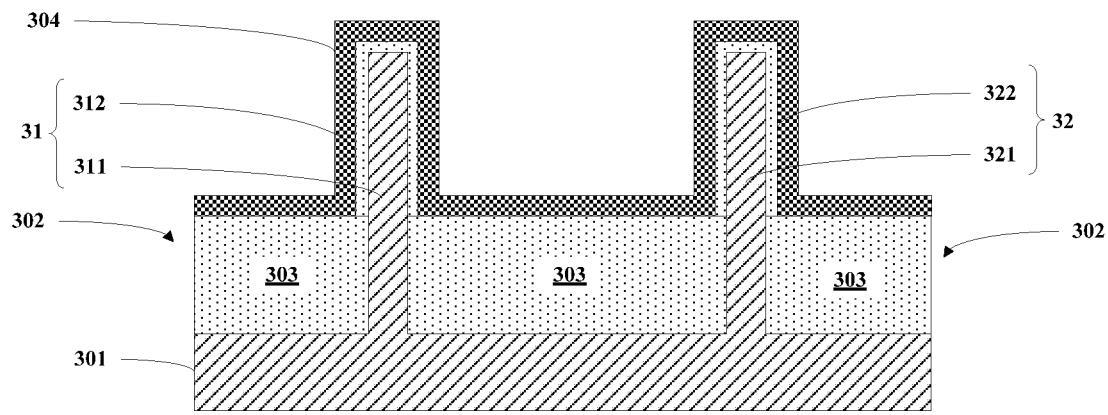
FIG. 3A to FIG. 3N are cross-sectional views schematically showing structures at several stages of a manufacturing process of a semiconductor device.
Figure 3B:
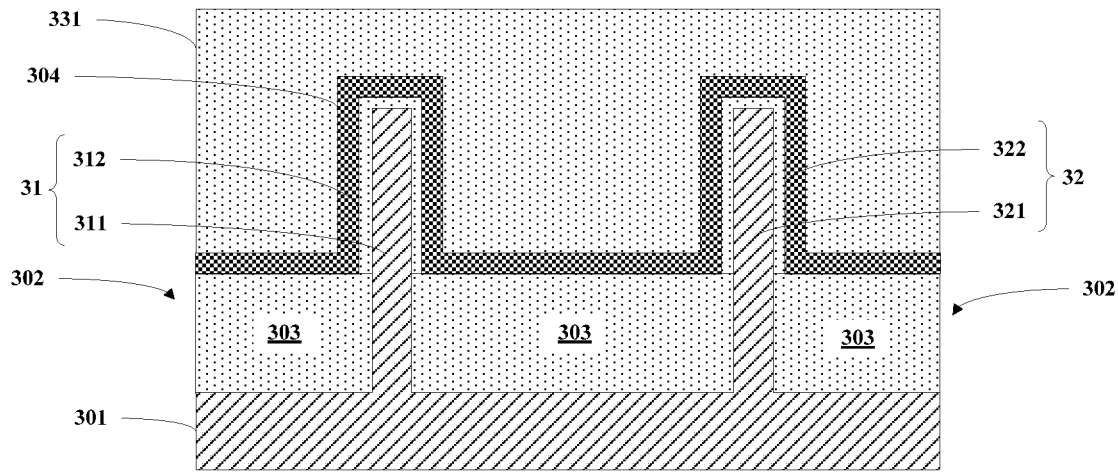
Figure 3C:
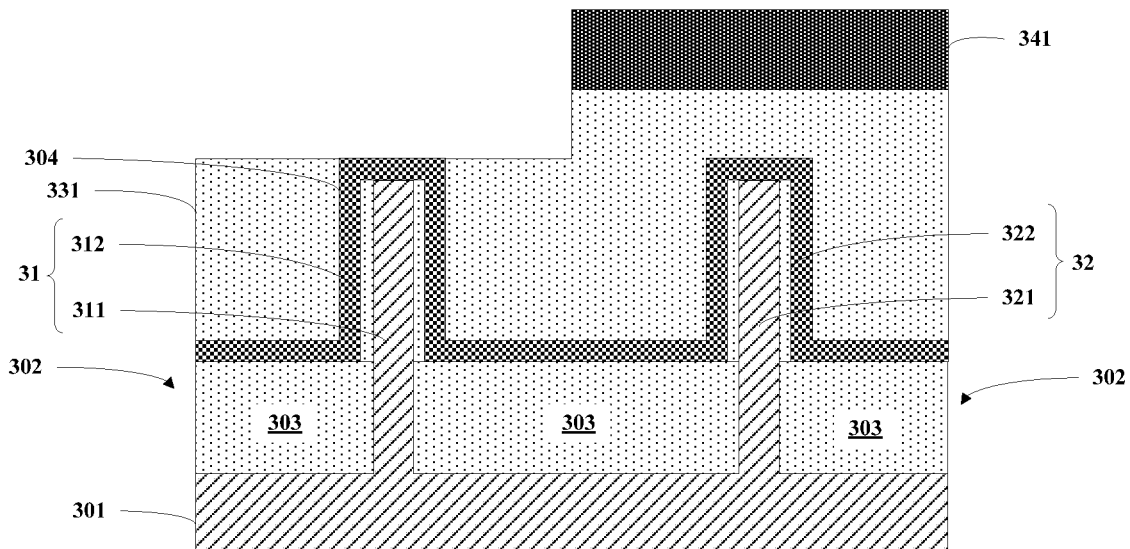
Figure 3D:
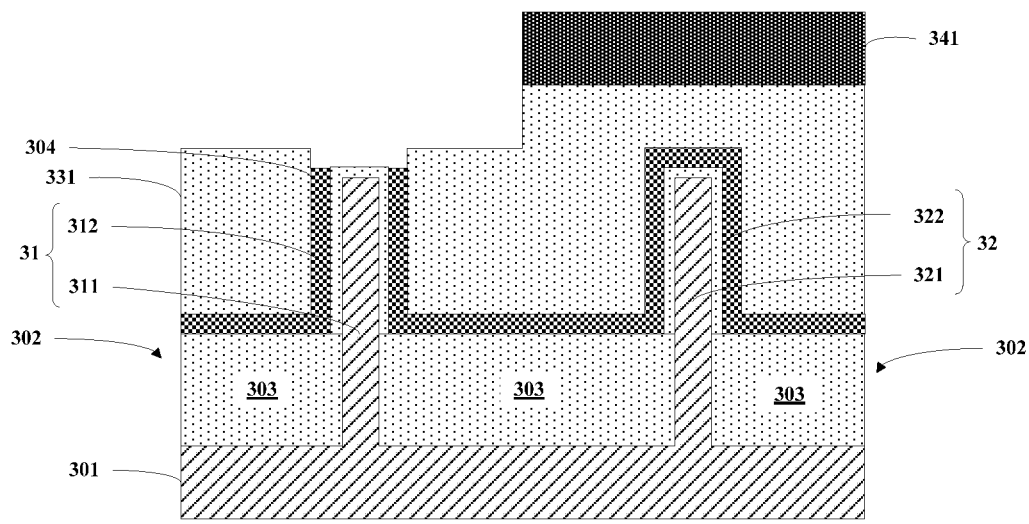
Figure 3E:
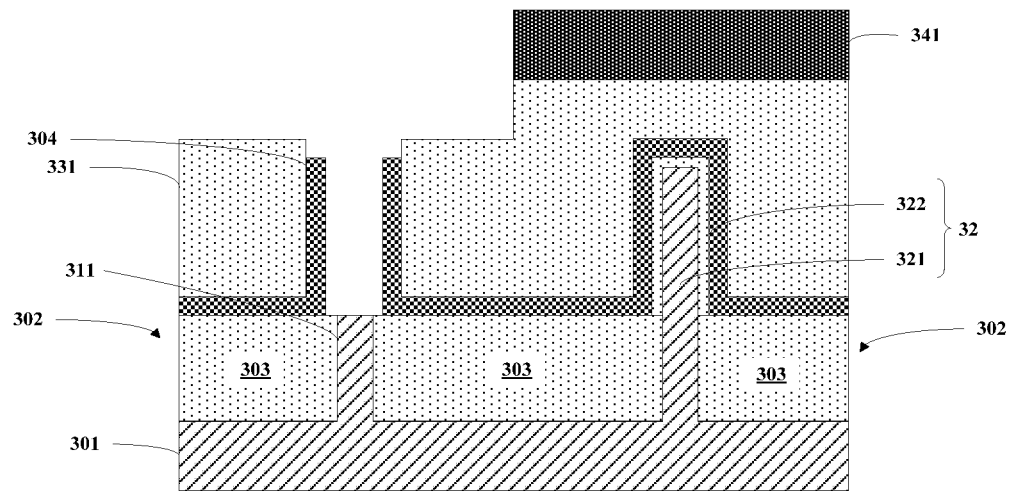
Figure 3F:
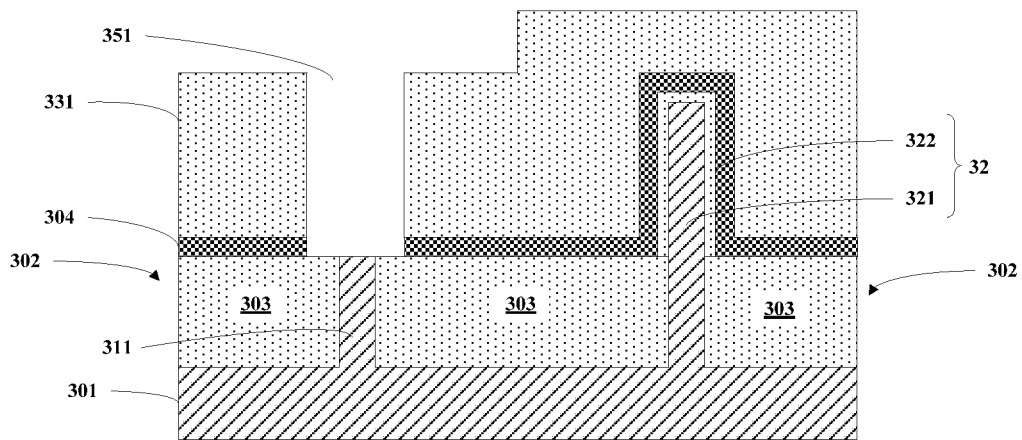
Figure 3G:
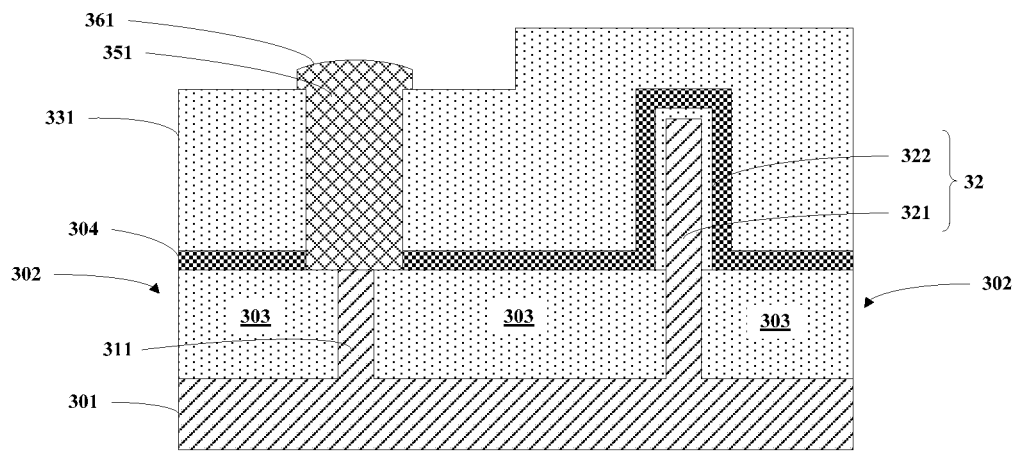
Figure 3H:
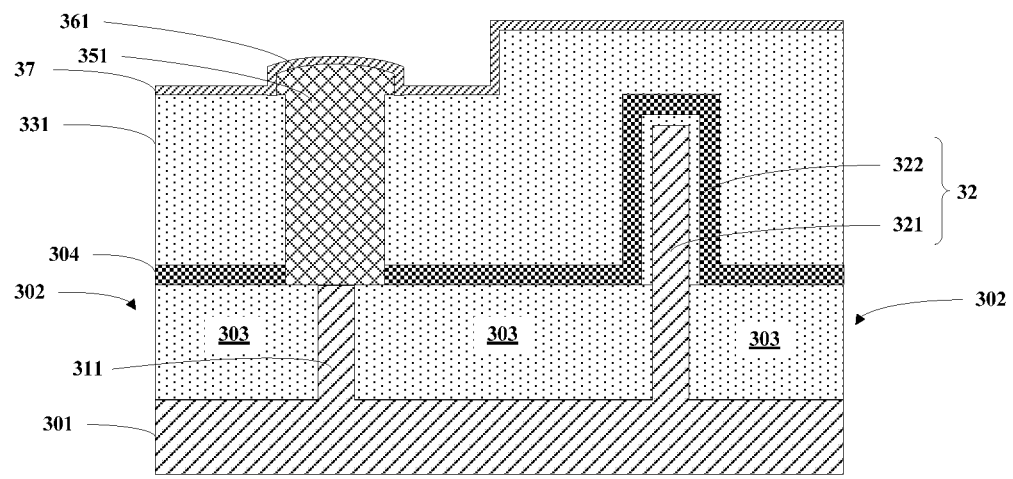
Figure 3I:
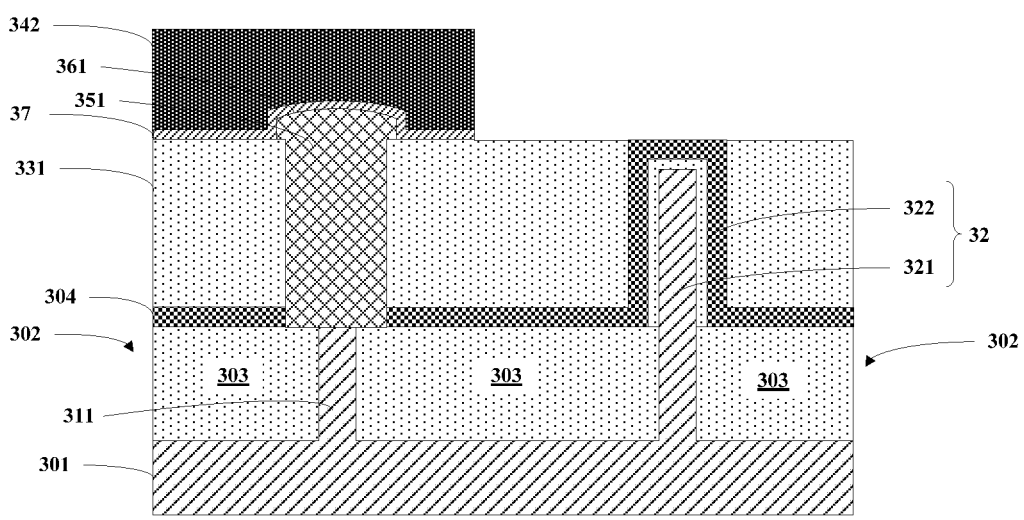
Figure 3J:
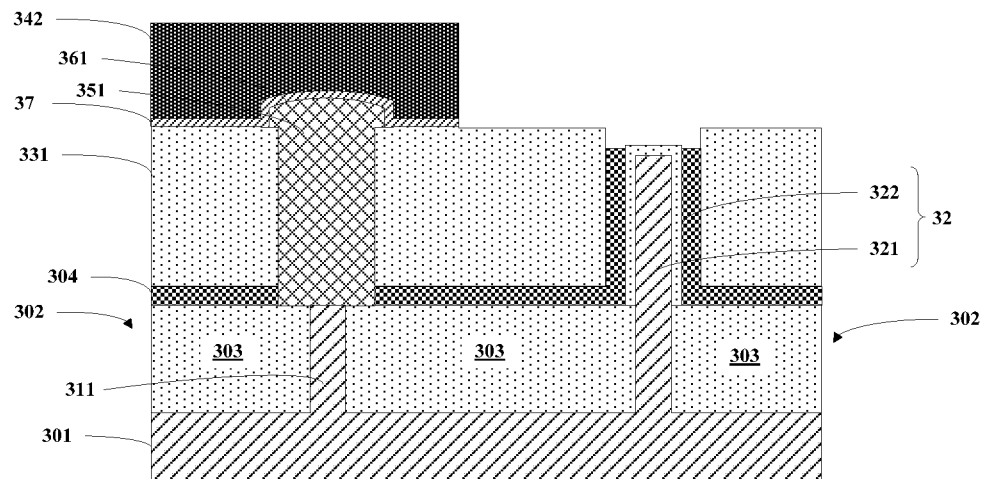
Figure 3K:
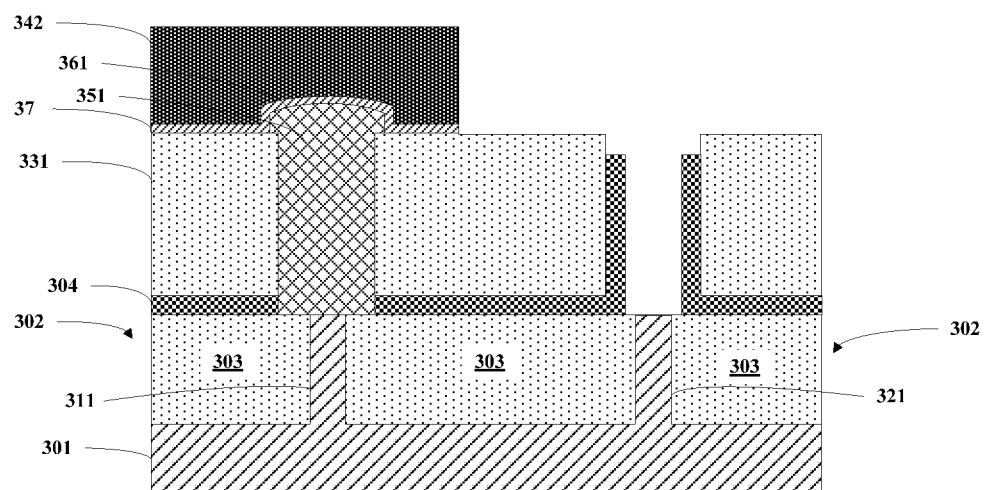
Figure 3L:
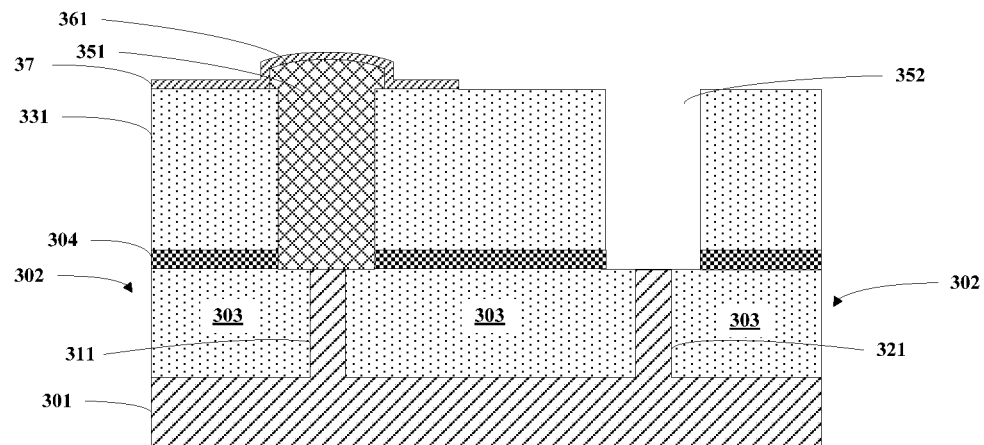
Figure 3M:
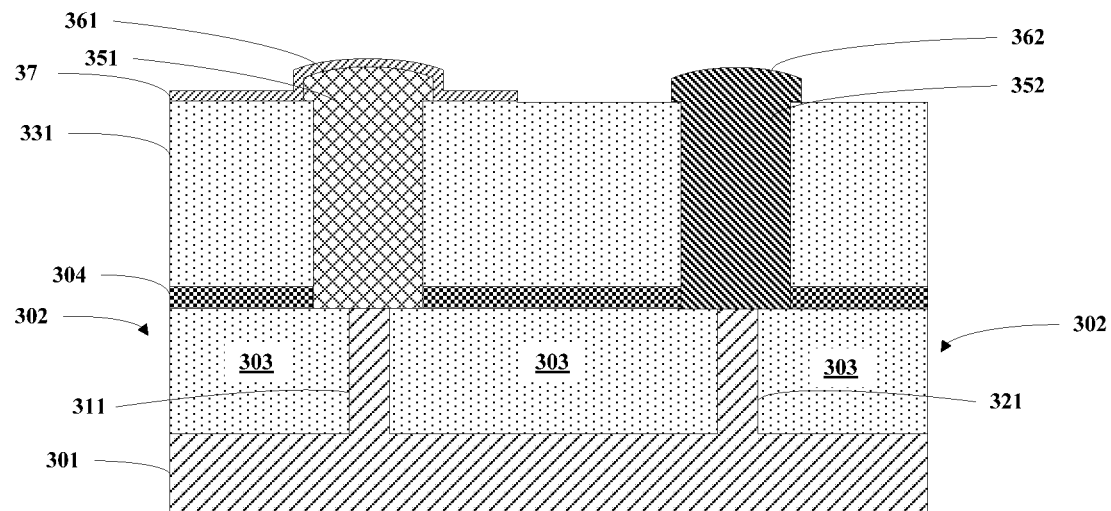
Figure 3N:
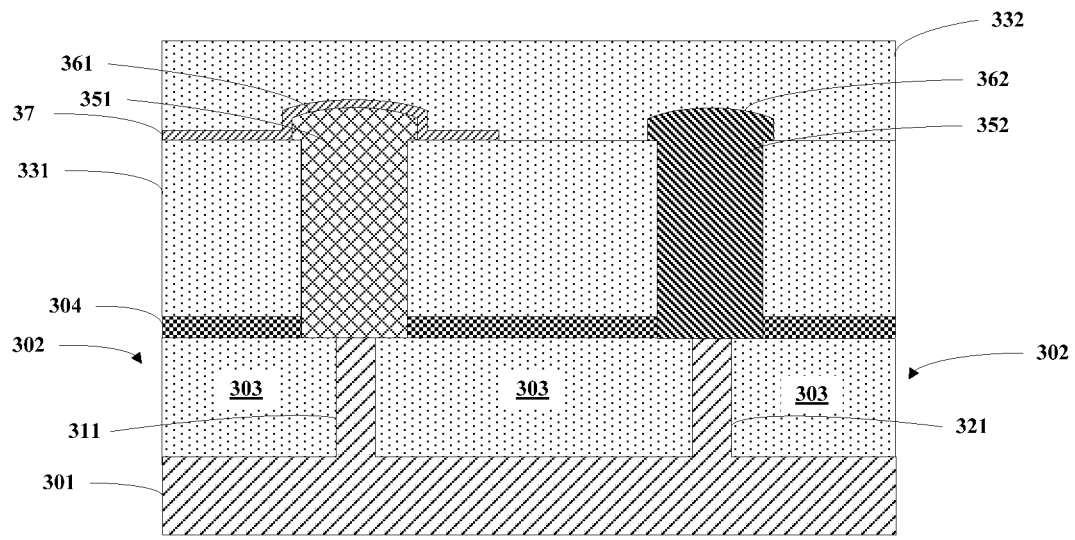

FIG. 3A to FIG. 3N are cross-sectional views schematically showing structures at several stages of a manufacturing process of a semiconductor device. Some forms of the manufacturing process of the semiconductor device are described in detail below with reference to FIG. 3A to FIG. 3N.

First, as shown in FIG. 3A, a semiconductor structure is provided. The semiconductor structure may include: a substrate (for example, a silicon substrate) 301, and a first fin 31 and a second fin 32 spaced on the substrate 301. Optionally, the first fin 31 may include: a first semiconductor fin (for example, silicon) 311 on the substrate 301 and a first insulator layer (for example, silicon dioxide) 312 on a surface of the first semiconductor fin 311. Optionally, the second fin 32 may include: a second semiconductor fin (for example, silicon) 321 on the substrate 301 and a second insulator layer (for example, silicon dioxide) 322 on a surface of the second semiconductor fin 321. In some implementations, a conduction type of the first semiconductor fin and a conduction type of the second semiconductor fin may be opposite. For example, the conduction type of the first semiconductor fin may be N-type, and the first semiconductor fin is used to form a PMOS device (which may be used as a PU transistor), and the conduction type of the second semiconductor fin may be P-type, and the second semiconductor fin is used to from an NMOS device (which may be used as a PD transistor). In other implementations, the conduction type of the first semiconductor fin and the conduction type of the second semiconductor fin may be the same.

In other implementations, the first fin 31 may include only the first semiconductor fin 311 but does not include the first insulator layer 312, and the second fin 32 may include only the second semiconductor fin 321 but does not include the second insulator layer 322. Therefore, the scope of the present disclosure is not limited to only the structure forms of the first fin and the second fin disclosed herein, similarly hereinafter.

In some implementations, in the step of providing the semiconductor structure, as shown in FIG. 3A, the semiconductor structure may further include: a trench 302 around the first fin 31 and the second fin 32, and a trench insulator layer (for example, silicon dioxide) 303 partially filling the trench 302. Optionally, as shown in FIG. 3A, the semiconductor structure may further include a separating coverage layer 304 covering the first fin 31, the second fin 32, and the trench insulator layer 303. For example, the material of the separating coverage layer 304 may include silicon nitride. For example, the separating coverage layer may be formed by using a deposition process.

Thereafter, as shown in FIG. 3B, a first interlayer dielectric layer 331 is deposited on the semiconductor structure shown in FIG. 1. For example, the material of the first interlayer dielectric layer may include silicon dioxide. The first interlayer dielectric layer 331 is formed on the separating coverage layer 304. The first interlayer dielectric layer 331 covers the first fin 31 and the second fin 32. Optionally, the manufacturing method may include: performing planarization treatment (for example, chemical mechanical planarization (CMP)) on the first interlayer dielectric layer.

Thereafter, first partial etching is performed on the first interlayer dielectric layer 331 to expose a top of the first fin 31. This step is described in detail below with reference to FIG. 3C and FIG. 3D.

For example, as shown in FIG. 3C, first partial etching is performed on the first interlayer dielectric layer 331 using the separating coverage layer 304 as an etch stop layer, to expose a part of the separating coverage layer 304 on the top of the first fin 31. Optionally, in the process of the first etching, a patterned first mask layer (for example, a photoresist) 341 may be formed on the first interlayer dielectric layer 331, where the first mask layer 341 exposes a part of the first interlayer dielectric layer 331 on and around the first fin 31; then first partial etching is performed on the first interlayer dielectric layer using the first mask layer as a mask, so as to expose the part of the separating coverage layer 304 on the top of the first fin 31.

Then, as shown in FIG. 3D, the exposed part of the separating coverage layer 304 on the top of the first fin 31 is removed, to expose the top of the first fin 31, for example, to expose the a top of the first insulator layer 312.

Thereafter, a part of the first fin is removed to form a first groove. Optionally, this step may include: removing the part of the first fin 31 and a part of the separating coverage layer 304 on a side wall of the removed part of the first fin 31, to form the first groove. This process is described in detail below with reference to FIG. 3E and FIG. 3F.

For example, as shown in FIG. 3E, after the top of the first fin is exposed, the part of the first fin 31 is removed by using, for example, an etching process, to expose the part of the separating coverage layer 304 on the side wall of the removed part of the first fin. For example, a part of the first semiconductor fin 311 and a part of the first insulator layer 312 on the surface of the first semiconductor fin 311 are removed.

Then, as shown in FIG. 3F, after the foregoing part of the first fin 31 is removed, the part of the separating coverage layer 304 on the side wall of the removed part of the first fin is removed by using, for example, a wet etching process (for example, phosphoric acid ($H_3PO_4$) may be used), to form the first groove 351. This step of removing the part of the separating coverage layer on the removed part of the first fin can enable the size of the first groove to be relatively large. This helps to increase the size of a subsequently formed first electrode.

In some implementations, the first mask layer 341 may be removed by using an ashing and wet removal process before the part of the separating coverage layer 304 is removed. Preferably, after the first mask layer 341 is removed and before the part of the separating coverage layer 304 is removed, the manufacturing method may further include: forming a top insulator layer (not shown, which may be, for example, a silicon dioxide layer) on a top of a remaining part of the first fin (for example, the first semiconductor fin) using an in-situ oxidation process. This helps to protect the top of the first semiconductor fin in the subsequent process of removing the part of the separating coverage layer 304.

Thereafter, as shown in FIG. 3G, a first electrode 361 is epitaxially grown in the first groove 351. The first electrode may fill the first groove to be full, and may epitaxially grow out of the first groove. For example, the first electrode 361 may be a first source or a first drain. For example, when the first semiconductor fin is used to form a PMOS device, the material of the first electrode may include SiGe. In some implementations, in the process of epitaxially growing the first electrode, the manufacturing method may further include: doping the first electrode.

Thereafter, optionally, as shown in FIG. 3H, a cover layer 37 is deposited on the semiconductor structure (for example, the semiconductor structure shown in FIG. 3G) on which the first electrode has been epitaxially grown. For example, the material of the cover layer may include silicon nitride. The cover layer can protect the formed first electrode, to prevent a material layer of a second electrode from epitaxially growing on the first electrode.

Thereafter, second partial etching is performed on the first interlayer dielectric layer 331 to expose a top of the second fin 32. This step is described in detail below with reference to FIG. 3I and FIG. 3J.

For example, as shown in FIG. 3I, second partial etching is performed on the first interlayer dielectric layer 331 and the cover layer 37 by using the separating coverage layer 304 as an etch stop layer, to expose a part of the separating coverage layer 304 on the top of the second fin 32. Optionally, in the process of the second etching, a patterned second mask layer (for example, a photoresist) 342 may be formed on the first interlayer dielectric layer 331, where the second mask layer 342 exposes a part of the cover layer 37 on and around the second fin 32; then second partial etching is performed on the first interlayer dielectric layer and the cover layer by using the second mask layer as a mask, so as to expose the part of the separating coverage layer 304 on the top of the second fin 32.

Then, as shown in FIG. 3J, the exposed part of the separating coverage layer 304 on the top of the second fin 32 is removed, to expose the top of the second fin 32, for example, expose a top of the second insulator layer 322.

Thereafter, a part of the second fin is removed to form a second groove. Optionally, this step may include: removing the part of the second fin 32 and a part of the separating coverage layer 304 on a side wall of the removed part of the second fin 32, to form the second groove. This process is described in detail below with reference to FIG. 3K and FIG. 3L.

For example, as shown in FIG. 3K, after the top of the second fin is exposed, the part of the second fin 32 is removed by using, for example, an etching process, to expose the part of the separating coverage layer 304 on the side wall of the removed part of the second fin. For example, a part of the second semiconductor fin 321 and a part of the second insulator layer 322 on the surface of the second semiconductor fin 321 are removed.

Then, as shown in FIG. 3L, after the foregoing part of the second fin 32 is removed, the part of the separating coverage layer 304 on the side wall of the removed part of the second fin is removed by using, for example, a wet etching process (for example, phosphoric acid ($H_3PO_4$) may be used), to form the second groove 352. This step of removing the part of the separating coverage layer on the removed part of the second fin can enable the size of the second groove to be relatively large. This helps to increase the size of a subsequently formed second electrode.

In some implementations, the second mask layer 342 may be removed by using an ashing and wet removal process before the part of the separating coverage layer 304 is removed. Preferably, after the second mask layer 342 is removed and before the part of the separating coverage layer 304 is removed, the manufacturing method may further include: forming a top insulator layer (not shown, which may be, for example, a silicon dioxide layer) on a top of a remaining part of the second fin (for example, the second semiconductor fin) by using an in-situ oxidation process. This helps to protect the top of the second semiconductor fin in the subsequent process of removing the part of the separating coverage layer 304.

Thereafter, as shown in FIG. 3M, a second electrode 362 is epitaxially grown in the second groove 352. The second electrode may fill the second groove to the full, and may epitaxially grow out of the second groove. For example, the second electrode 362 may be a second source or a second drain. For example, when the second semiconductor fin is used to form an NMOS device, the material of the second electrode may include SiP. In some implementations, in the process of epitaxially growing the second electrode, the manufacturing method may further include: doping the second electrode.

Thereafter, optionally, as shown in FIG. 3N, a second interlayer dielectric layer 332 is formed, by using, for example, a deposition process, on the semiconductor structure (for example, the semiconductor structure shown in FIG. 3M) on which the second electrode has been epitaxially grown. For example, the material of the second interlayer dielectric layer 332 may include silicon dioxide.

Thereafter, optionally, annealing treatment is performed on the semiconductor structure (for example, the semiconductor structure shown in FIG. 3N) on which the second interlayer dielectric layer has been formed. The annealing treatment may be used to activate impurities doped in the first electrode and the second electrode.

Thereafter, optionally, planarization treatment (for example, CMP) is performed on the semiconductor structure on which the annealing treatment has been performed. For example, planarization treatment is performed on the second interlayer dielectric layer 332.

Hereto, forms of a manufacturing method for a semiconductor device according to the present disclosure are provided. By means of the foregoing manufacturing method, electrodes of two devices are separated without reducing the sizes of the electrodes (that is, epitaxial bodies), and a first interlayer dielectric layer is filled between the electrodes (that is, a first electrode and a second electrode) of the two devices, so that the electrodes of the two devices are further disconnected, thereby addressing a problem in the prior art that electrode epitaxial bodies of different devices are connected.

Further, when one of the first fin or the second fin is used to form a PMOS transistor and the other is used to form an NMOS transistor, the problem that source/drain epitaxial bodies of the PMOS transistor and the NMOS transistor in a SRAM are connected can be addressed, thereby resolving the problem that Vdd and Vss are bridged.

In addition, in forms of the foregoing method, the first electrode and the second electrode are epitaxially grown after the first interlayer dielectric layer is formed by deposition. That is, the two electrodes have not been epitaxially grown when the first interlayer dielectric layer is deposited. Therefore, a gap between the first electrode and the second electrode is quite easy to be filled, thereby addressing the problem of filling of an interlayer dielectric layer between two electrode epitaxial bodies in the prior art.

Further, a self-aligning process is applied to the two epitaxial bodies, the first electrode and the second electrode, and therefore the quality of the first electrode and the second electrode is improved.

Based on forms of the foregoing manufacturing methods, a semiconductor device is further formed. For example, as shown in FIG. 3N, the semiconductor device may include: the substrate 301; the first semiconductor fin 311 and the second semiconductor fin 321 spaced on the substrate 301; and the first interlayer dielectric layer 331 on the substrate 301 and covering the first semiconductor fin 311 and the second semiconductor fin 321. The first groove 351 exposing the first semiconductor fin 311 and the second groove 352 exposing the second semiconductor fin 321 are formed on the first interlayer dielectric layer 331, and the second groove 352 is separated from the first groove 351. As shown in FIG. 3N, the semiconductor device may further include: the first electrode 361 on the first semiconductor fin 311 and epitaxially growing in the first groove 351, and the second electrode 362 on the second semiconductor fin 321 and epitaxially growing in the second groove 352.

In this implementation, a semiconductor device is provided. In the semiconductor device, a first electrode on a first semiconductor fin and a second electrode on a second semiconductor fin are separated by a first interlayer dielectric layer, thereby addressing a problem in the prior art that electrode epitaxial bodies of different devices are connected. Moreover, there is no problem of gap filling in the first interlayer dielectric layer.

Further, when one of the first semiconductor fin or the second semiconductor fin is used to form a PMOS transistor and the other is used to form an NMOS transistor, the problem that source/drain epitaxial bodies of the PMOS transistor and the NMOS transistor in a SRAM are connected can be addressed, thereby addressing the problem that Vdd and Vss are bridged.

In addition, because the first electrode and the second electrode in the semiconductor device are respectively formed by epitaxial growing in a first groove and a second groove, the shapes of the first electrode and the second electrode are affected by the shapes of the first groove and the second groove, and are different from the shape of an epitaxial body electrode in the prior art.

Optionally, as shown in FIG. 3N, the semiconductor device may further include: the trench 302 around the first semiconductor fin 311 and the second semiconductor fin 321, and the trench insulator layer 303 partially filling the trench.

Optionally, as shown in FIG. 3N, the semiconductor device may further include: the separating coverage layer 304 covering the trench insulator layer 303. The first interlayer dielectric layer 331 is located on the separating coverage layer 304.

Optionally, as shown in FIG. 3N, the semiconductor device may further include: a cover layer 37 on a part of the first interlayer dielectric layer 331 and the first electrode 361.

Optionally, as shown in FIG. 3N, the semiconductor device may further include: a second interlayer dielectric layer 332 on the cover layer 37 and the first interlayer dielectric layer 331.

Figure 4:
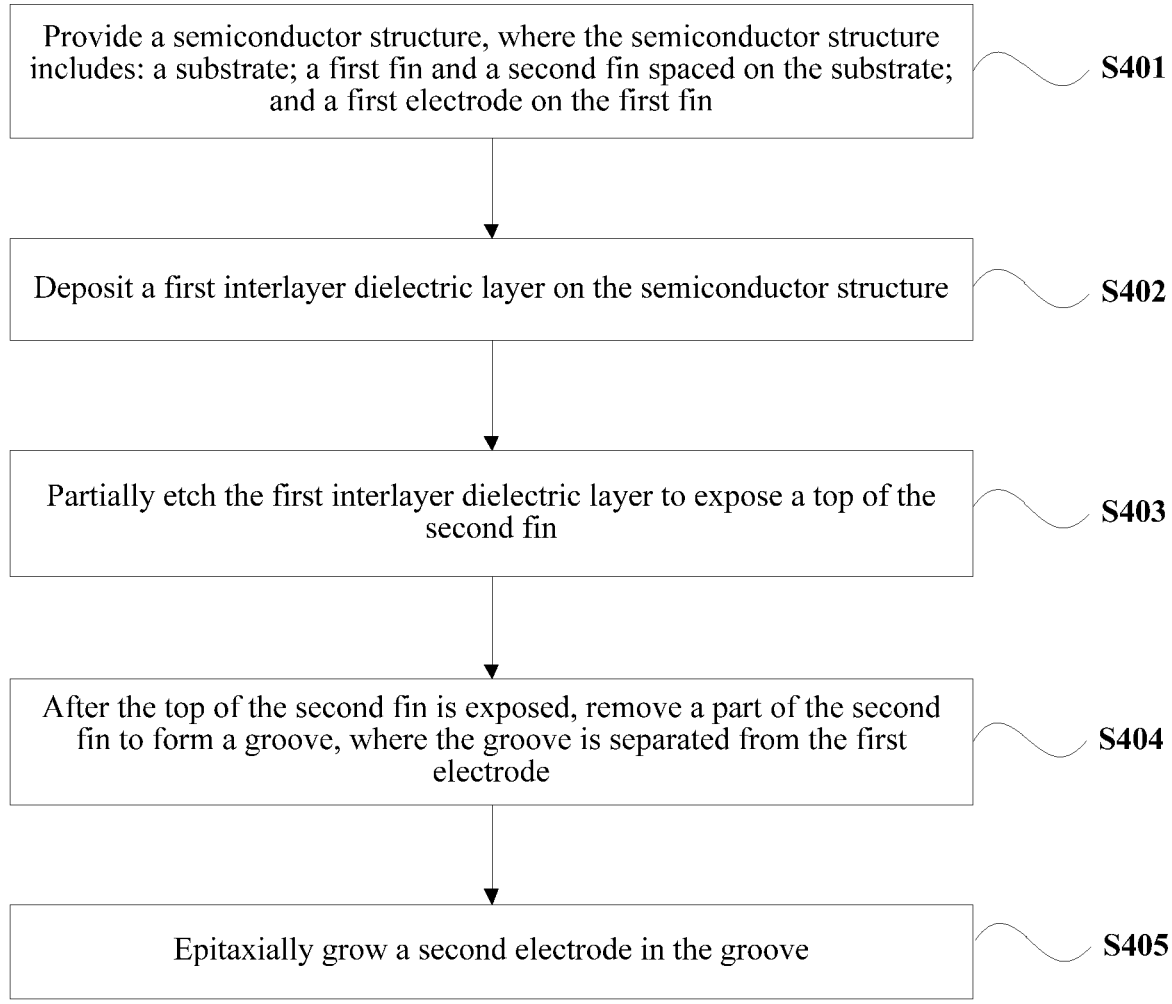
FIG. 4 is a flowchart showing a manufacturing method for a semiconductor device according to another form of the present disclosure.

FIG. 4 is a flowchart showing another form of a manufacturing method for a semiconductor device.

In step S401, a semiconductor structure is provided, where the semiconductor structure includes: a substrate; a first fin and a second fin spaced on the substrate; and a first electrode on the first fin.

In step S402, a first interlayer dielectric layer is deposited on the semiconductor structure.

In step S403, the first interlayer dielectric layer is partially etched to expose a top of the second fin.

In step S404, after the top of the second fin is exposed, a part of the second fin is removed to form a groove, where the groove is separated from the first electrode. That is, the groove does not expose the first electrode.

In step S405, a second electrode is epitaxially grown in the groove.

In this implementation, another manufacturing method for a semiconductor device is provided. In the manufacturing method, a first interlayer dielectric layer is deposited on a semiconductor structure, then the first interlayer dielectric layer is etched to expose a top of a second fin, a groove is obtained by removing a part of the second fin, and a second electrode is epitaxially grown in the groove. Because the groove is separated from a first electrode by the first interlayer dielectric layer, the second electrode is also separated from the first electrode by the first interlayer dielectric layer. This helps to separate (that is, disconnect) the electrodes on the two fins without reducing the sizes of the electrodes (that is, epitaxial bodies), thereby addressing a problem in the prior art that electrode epitaxial bodies of different devices are connected.

Further, when one of the first fin and the second fin is used to form a PMOS transistor and the other is used to form an NMOS transistor, the problem that source/drain epitaxial bodies of the PMOS transistor and the NMOS transistor in a SRAM are connected can be addressed, thereby resolving the problem that Vdd and Vss are bridged.

In addition, in the foregoing method, the second electrode is epitaxially grown after the first interlayer dielectric layer is formed by deposition. That is, the second electrode has not been epitaxially grown when the first interlayer dielectric layer is deposited. Therefore, a gap between the first electrode and the second electrode is quite easy to be filled, thereby addressing the problem of filling of an interlayer dielectric layer between two electrode epitaxial bodies in the prior art. Because the problem of filling of the interlayer dielectric layer is resolved, there is no gap between the electrodes, and electrodes of different devices may not be bridged in a process of forming a contactor.

In some implementations, before the second electrode is epitaxially grown, the manufacturing method may further include: performing enlargement treatment on the groove, where the groove on which enlargement treatment has been performed is separated from the first electrode. The step of epitaxially growing a second electrode in the groove may include: epitaxially growing the second electrode in the groove on which enlargement treatment has been performed. This helps to increase the size of the second electrode, and increase a contact area, thereby decreasing a contact resistance. In addition, this can also help to increase a stress of the electrode (as a source or a drain) on a channel, and increase a current carrier mobility, thereby improving the performance of the device.

Figure 5A:
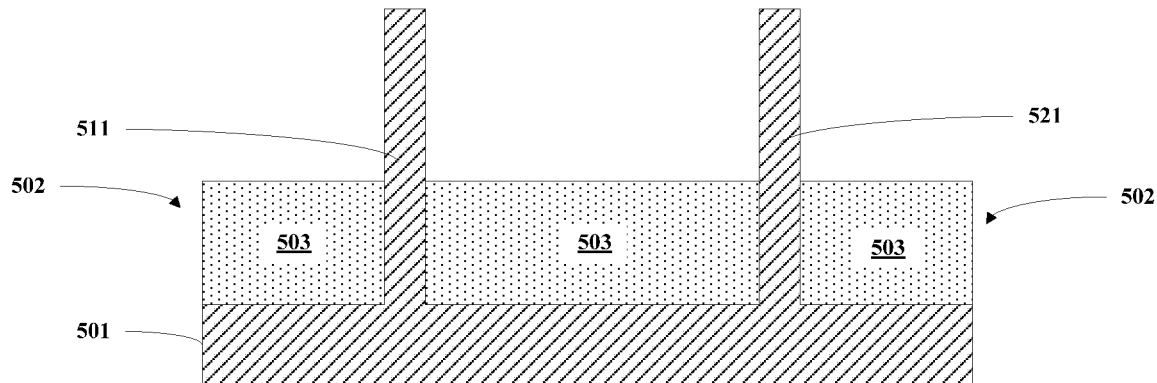
FIG. 5A to FIG. 5O are cross-sectional views schematically showing structures at several stages of a manufacturing process of a semiconductor device.
Figure 5B:
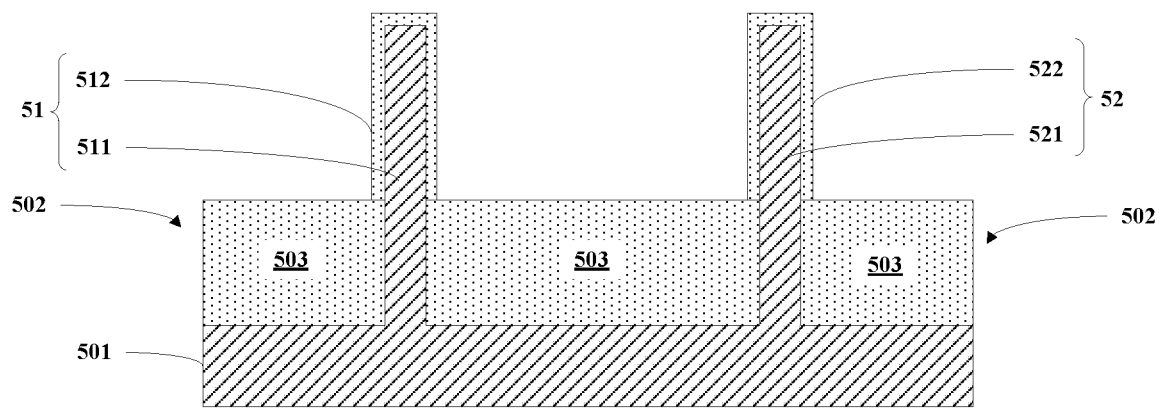
Figure 5C:
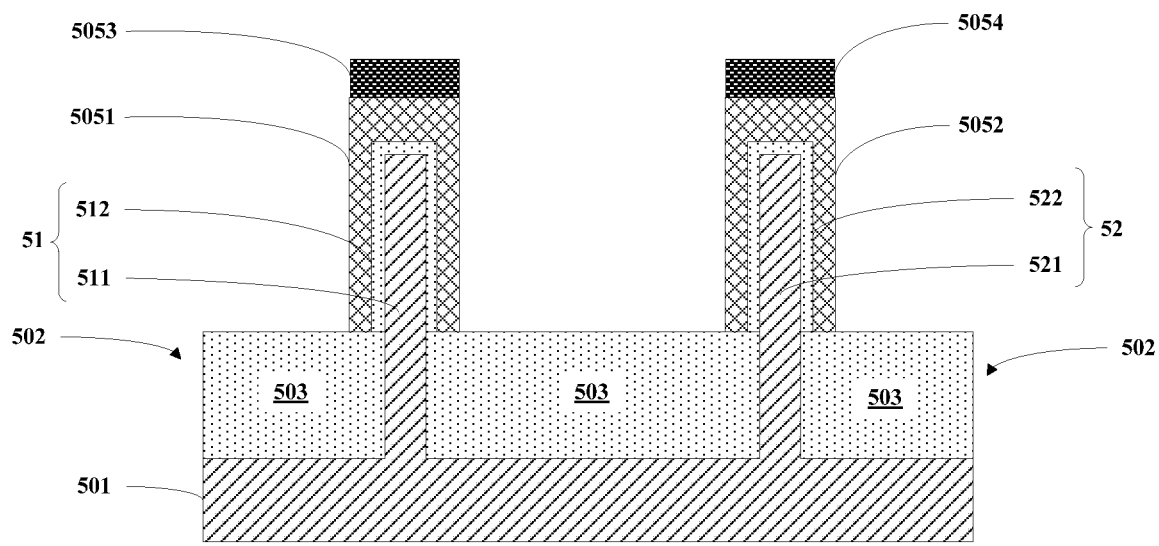
Figure 5D:
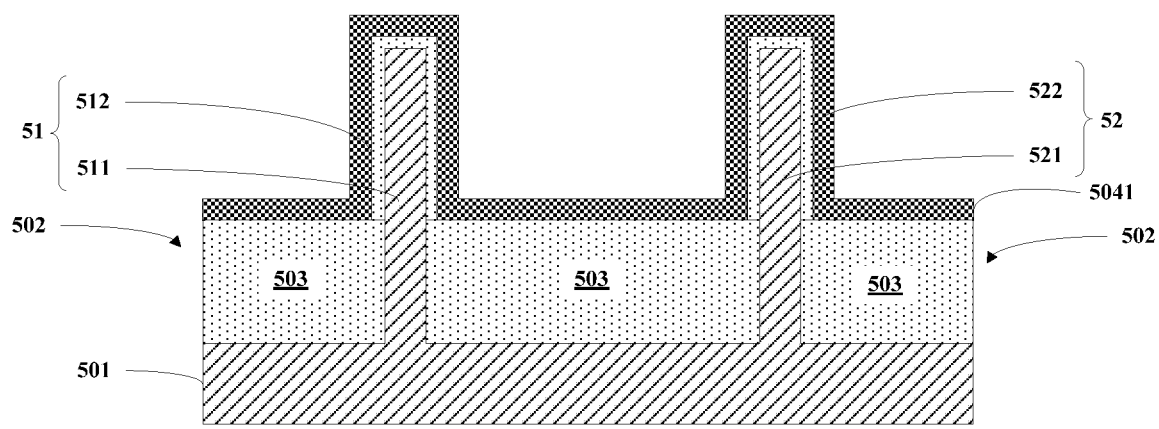
Figure 5E:
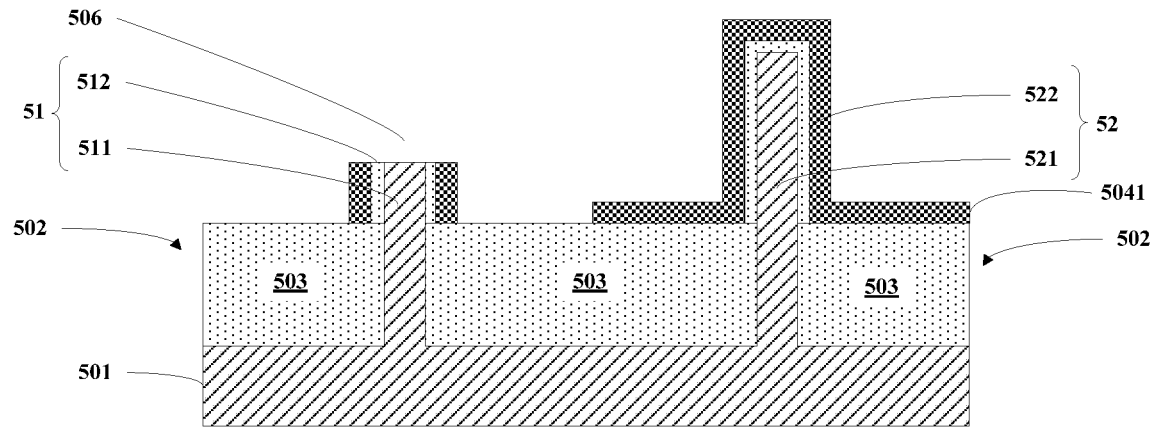
Figure 5F:
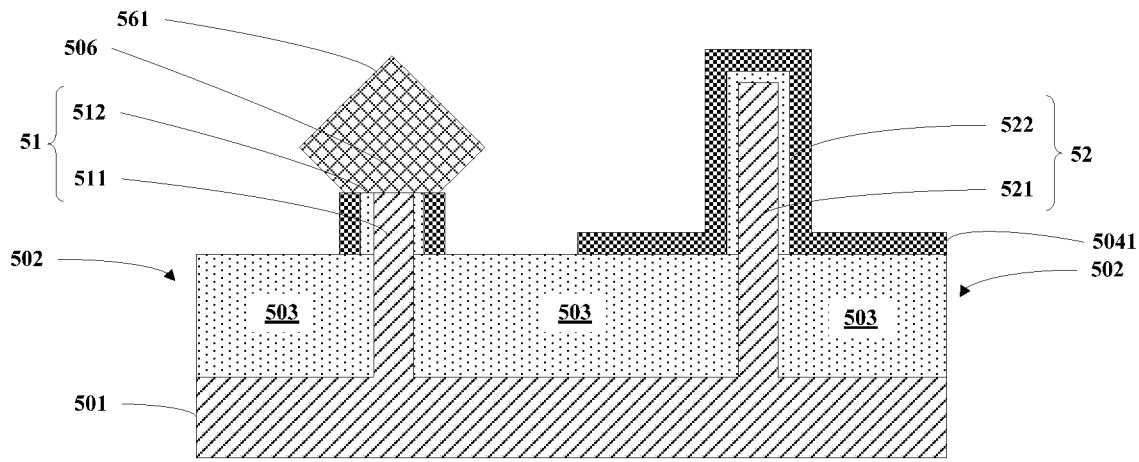
Figure 5G:
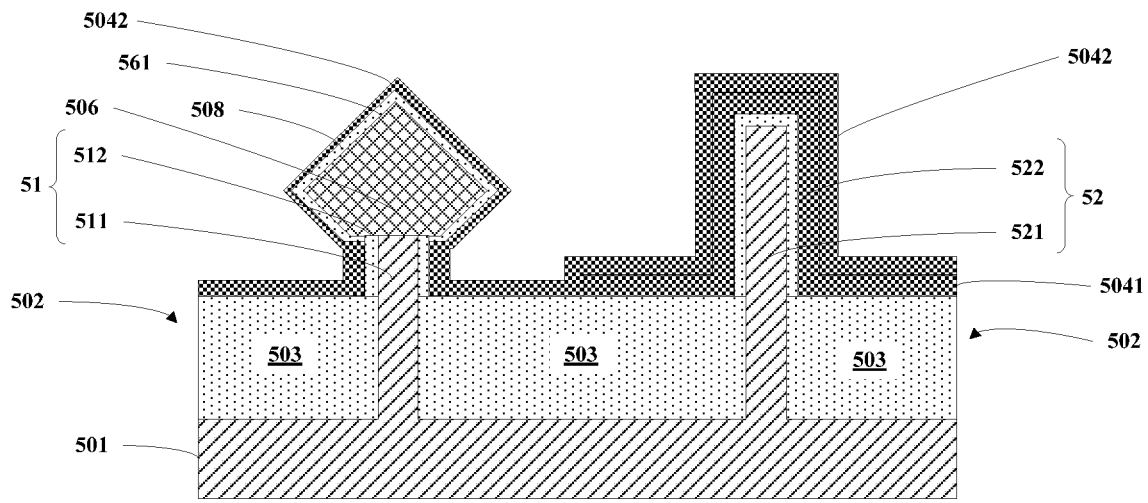
Figure 5H:
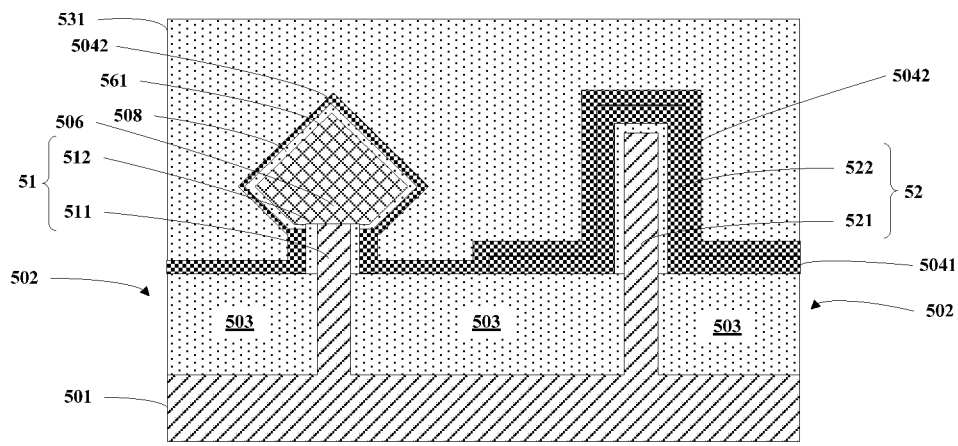
Figure 5I:
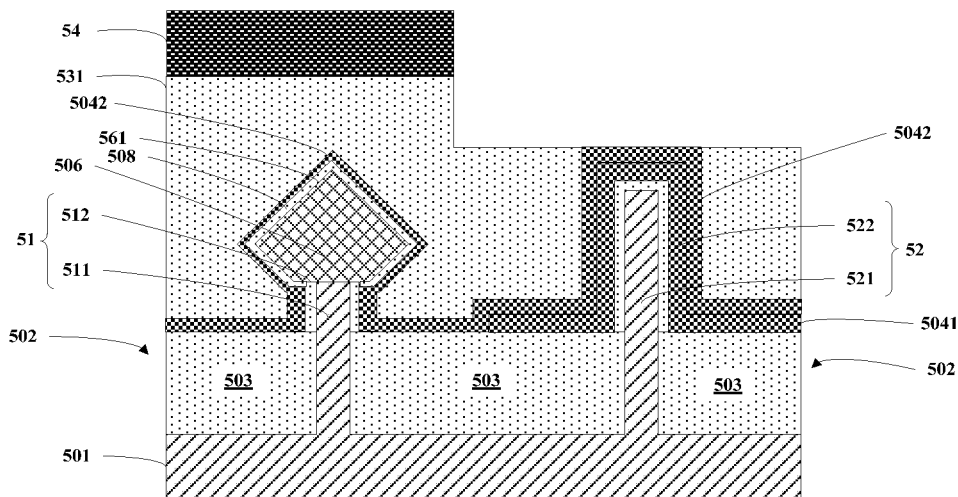
Figure 5J:
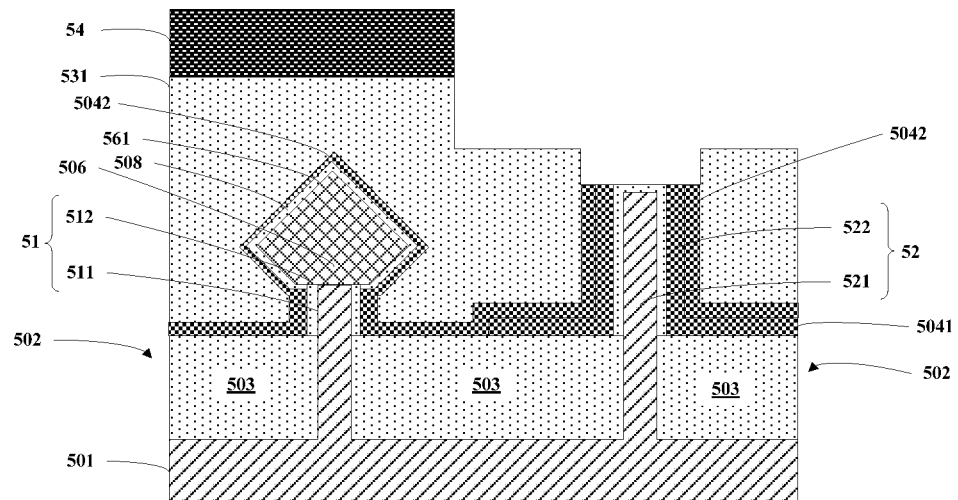
Figure 5K:
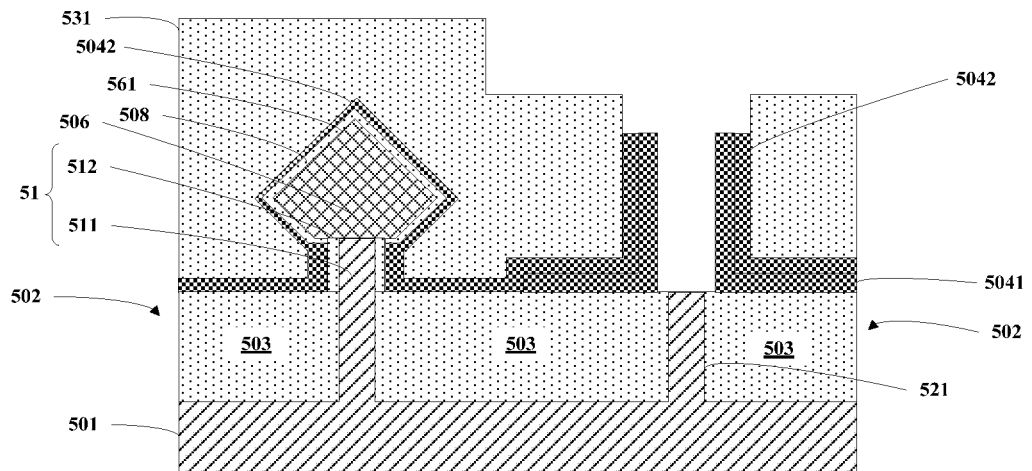
Figure 5L:
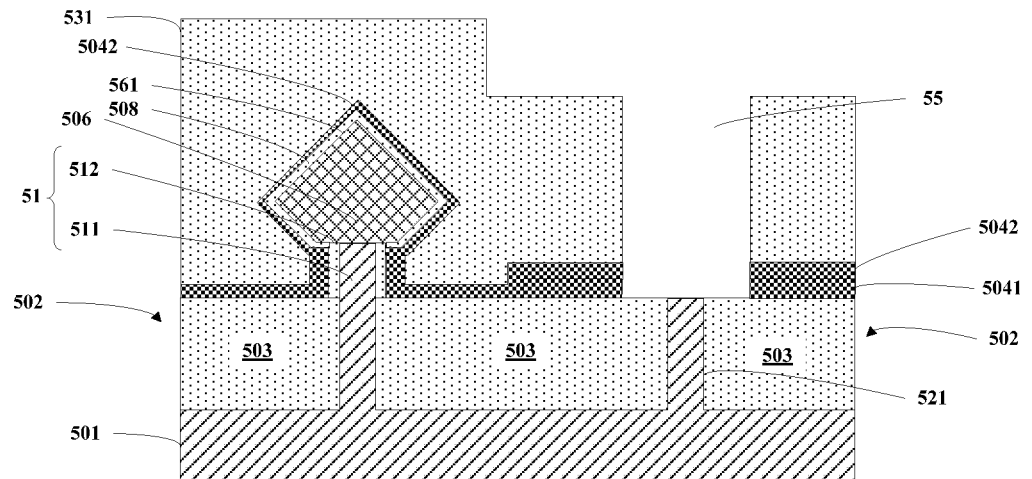
Figure 5M:
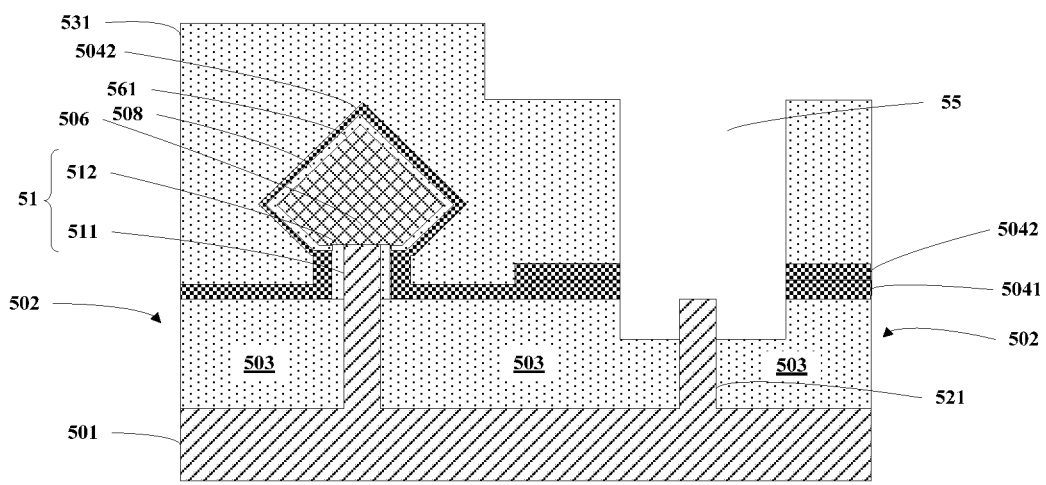
Figure 5N:
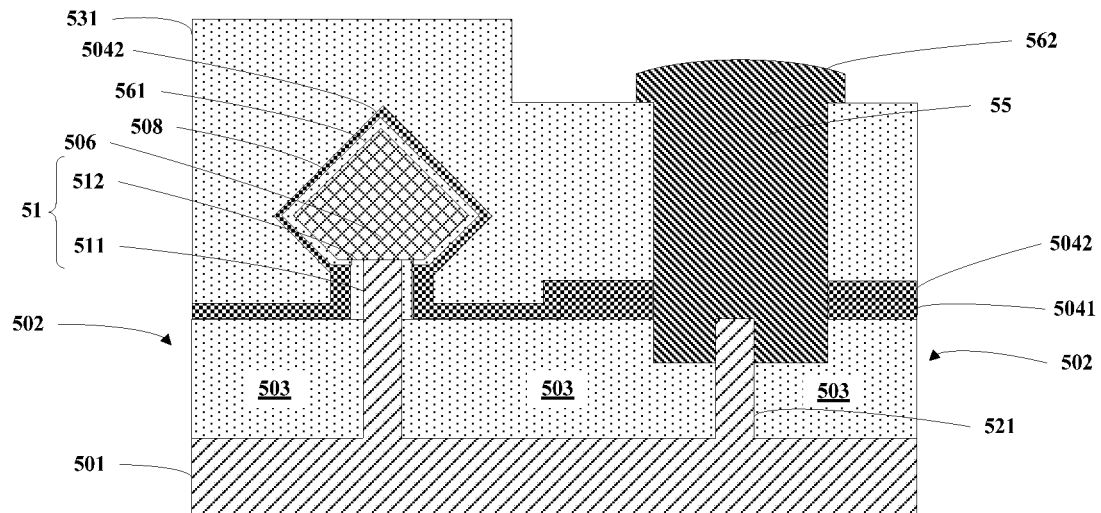
Figure 5O:
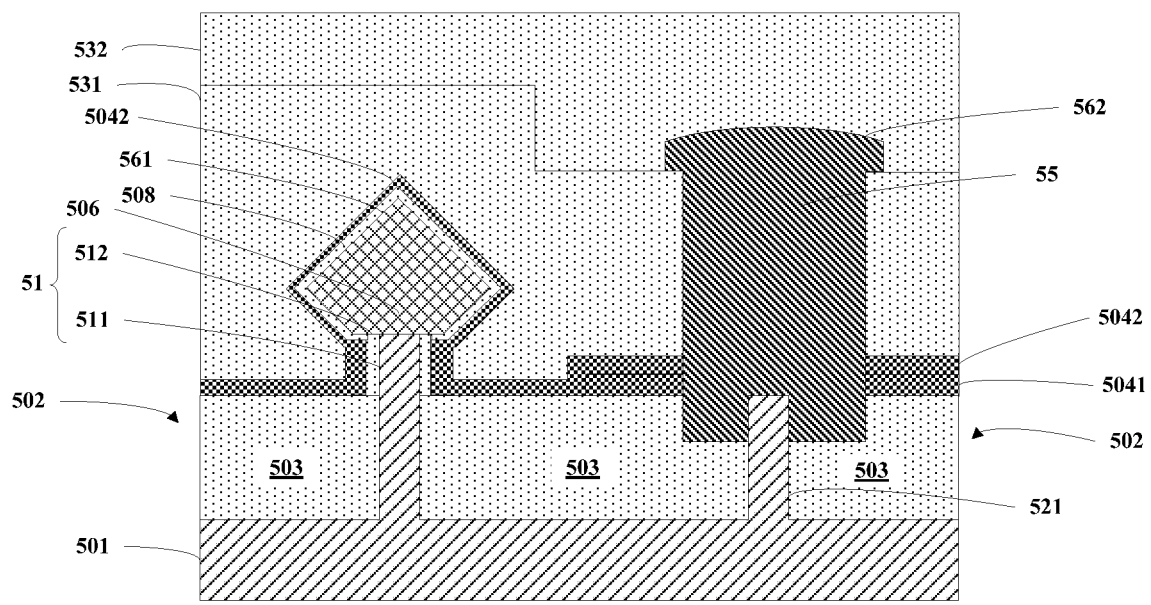

FIG. 5A to FIG. 5O are cross-sectional views schematically showing structures at several stages of a manufacturing process of a semiconductor device. Forms of a manufacturing process of the semiconductor device is described in detail below with reference to FIG. 5A to FIG. 5O.

First, a semiconductor structure is provided. The step of providing the semiconductor structure may be described in detail with reference to FIG. 5A to FIG. 5F.

For example, as shown in FIG. 5A, an initial structure is provided. The initial structure may include: a substrate (for example, a silicon substrate) 501, and a first semiconductor fin 511 and a second semiconductor fin 521 spaced on the substrate 501. For example, the first semiconductor fin 511 may be used to form a PMOS device, and the second semiconductor fin 512 may be used to form an NMOS device. Optionally, the initial structure may further include: a trench 502 around the first semiconductor fin 511 and the second semiconductor fin 521, and a trench insulator layer (for example, silicon dioxide) 503 partially filling the trench.

Thereafter, optionally, as shown in FIG. 5B, by using, for example, an oxidation process, a first insulator layer (for example, silicon dioxide) 512 is formed on a surface of the first semiconductor fin 511, and a second insulator layer (for example, silicon dioxide) 522 is formed on a surface of the second semiconductor fin 521. The first semiconductor fin 511 and the first insulator layer 512 can be together used as a first fin 51, and the second semiconductor fin 521 and the second insulator layer 522 can be together used as a second fin 52.

Thereafter, optionally, as shown in FIG. 5C, by using, for example, a deposition and patterning process, a first pseudo grid 5051 surrounding the first semiconductor fin 511 is formed on the first insulator layer 512, and a second pseudo grid 5052 surrounding the second semiconductor fin 521 is formed on the second insulator layer 522. The materials of the first pseudo grid 5051 and the second pseudo grid 5052 may include polycrystalline silicon. Optionally, as shown in FIG. 5C, a first hard mask layer 5053 and a second hard mask layer 5054 are further respectively formed on the first pseudo grid 5051 and the second pseudo grid 5052. The materials of the first hard mask layer 5053 and the second hard mask layer 5054 may include silicon nitride.

Thereafter, optionally, as shown in FIG. 5D, a first separating coverage layer (for example, silicon nitride) 5041 is formed, by using, for example, a deposition process, on the initial structure on which the first pseudo grid 5051 and the second pseudo grid 5052 have been formed. For example, the first separating coverage layer 5041 may act as a spacer on two sides of the first pseudo grid 5051 and the second pseudo grid 5052.

It should be noted that the structure shown in FIG. 5C is a cross-sectional view that is obtained by cutting along positions at which the pseudo grids are located, whereas the structure shown in FIG. 5D is a cross-sectional view that is obtained by cutting along positions on the two sides of the pseudo grids at which an electrode (a source or a drain) is to be formed.

Thereafter, as shown in FIG. 5E, the first semiconductor fin 511 and a part of the first insulator layer 512 and a part of the first separating coverage layer 5041 that are on the first semiconductor fin 511 are etched to form a groove 506.

Thereafter, as shown in FIG. 5F, a first electrode 561 is epitaxially grown in the groove 506. For example, the first electrode 561 may be a first source or a first drain. For example, the material of the first electrode 561 may include SiGe. In an embodiment, in the process of epitaxially growing the first electrode, the manufacturing method may further include: doping the first electrode.

Hereto, a semiconductor structure according to forms of the present disclosure is formed. As shown in FIG. 5F, the semiconductor structure may include: the substrate 501; the first fin 51 and the second fin 52 spaced on the substrate 501; and the first electrode 561 on the first fin 51. For example, the first fin 51 may include: the first semiconductor fin 511 on the substrate 501 and the first insulator layer 512 on the surface of the first semiconductor fin 512. For example, the second fin 52 may include: the second semiconductor fin 521 on the substrate 501 and the second insulator layer 522 on the surface of the second semiconductor fin 521.

In other implementations, the first fin 51 may include only the first semiconductor fin 511 but does not include the first insulator layer 512, and the second fin 52 may include only the second semiconductor fin 521 but does not include the second insulator layer 522. Therefore, the scope of the present disclosure is not limited to only the structure forms of the first fin and the second fin disclosed herein, similarly hereinafter.

Optionally, in the step of providing a semiconductor structure, as shown in FIG. 5F, the semiconductor structure may further include: the trench 502 around the first fin 51 and the second fin 52; the trench insulator layer 503 partially filling the trench; and the first separating coverage layer 5041 covering the first fin 51, the second fin 52, and a part of the trench insulator layer 503.

Thereafter, as shown in FIG. 5G, oxidation treatment is performed to form a surface insulator layer (for example, an oxide of silicon) 508 on the surface of the first electrode 561. Then, a second separating coverage layer 5042 is formed on the trench insulator layer 503, the surface insulator layer 508, and the first separating coverage layer 5041. The first separating coverage layer 5041 and the second separating coverage layer 5042 together act as a separating coverage layer, equivalent to increasing the thickness of the separating coverage layer on the second fin 52. For example, the increased thickness of the separating coverage layer (that is, the thickness of the second separating coverage layer 5042) may be 60 Å to 120 Å (for example, 100 Å).

Thereafter, as shown in FIG. 5H, a first interlayer dielectric layer 531 is deposited on the semiconductor structure shown in FIG. 5G. For example, the material of the first interlayer dielectric layer may include silicon dioxide. The first interlayer dielectric layer 531 is deposited on the second separating coverage layer 5042. Optionally, the manufacturing method may include: performing planarization treatment (for example, CMP) on the first interlayer dielectric layer 531.

Thereafter, the first interlayer dielectric layer is partially etched to expose a top of the second fin. This step is described in detail below with reference to FIG. 5I and FIG. 5J.

For example, as shown in FIG. 5I, the first interlayer dielectric layer 531 is partially etched by using the second separating coverage layer 5042 as an etch stop layer, to expose a part of the second separating coverage layer 5042 on the top of the second fin 52. Optionally, in the etching process, a patterned mask layer (for example, a photoresist) 54 may be formed on the first interlayer dielectric layer 531, where the mask layer 54 exposes a part of the first interlayer dielectric layer 531 on and around the second fin 52; then the first interlayer dielectric layer is partially etched by using the mask layer as a mask, so as to expose the part of the second separating coverage layer 5042 on the top of the second fin 52.

Then, as shown in FIG. 5J, the exposed part of the second separating coverage layer 5042 and an exposed part of the first separating coverage layer 5041 that are on the top of the second fin 52 are removed, to expose the top of the second fin 52, for example, expose a top of the second insulator layer 522.

Thereafter, a part of the second fin is removed to form a groove. Optionally, this step may include: removing the part of the second fin 52 and a part of the first separating coverage layer 5041 and a part of the second separating coverage layer 5042 that are on a side wall of the removed part of the second fin 52, to form the groove. This process is described in detail below with reference to FIG. 5K and FIG. 5L.

For example, as shown in FIG. 5K, after the top of the second fin is exposed, the part of the second fin 52 is removed by using, for example, an etching process, to expose the part of the first separating coverage layer 5041 and the part of the second separating coverage layer 5042 that are on the side wall of the removed part. For example, a part of the second semiconductor fin 521 and a part of the second insulator layer 521 on the surface of the second semiconductor fin 522 are removed.

Then, preferably, a top insulator layer (not shown, which may be, for example, a silicon dioxide layer) is formed on a top of a remaining part of the second fin 52 by using, for example, an oxidation process. This helps to protect the top of the second semiconductor fin in the subsequent process of removing the part of the first separating coverage layer 5041 and the part of the second separating coverage layer 5042. In some implementations, before the top insulator layer is formed, the mask layer 54 may be removed by using an ashing and wet removal process.

Thereafter, as shown in FIG. 5L, after the top insulator layer is formed, the exposed part of the first separating coverage layer 5041 and the exposed part of the second separating coverage layer 5042 (that is, the part of the first separating coverage layer 5041 and the part of the second separating coverage layer 5042 that are on the side wall of the removed part of the second fin) are removed by using, for example, a wet etching process (for example, $H_3PO_4$ may be used), so as to form the groove 55. This step of removing the exposed parts of the two separating coverage layers can enable a larger size of the groove. This helps to increase the size of a subsequently formed electrode.

Thereafter, as shown in FIG. 5M, enlargement treatment is performed on the groove 55 by using, for example, an etching (which may be, for example, isotropic etching, or for another example, may be etching by using dilute hydrofluoric acid (DHF), a SiCoNi process (In the SiCoNi process, a film is deposited on an oxide of silicon, and then heat treatment is performed, to generate gaseous DHF, so that the oxide of silicon can be etched. The process may be cyclically performed), or a Certas process (In the Certas process, a film is deposited on an oxide of silicon, and then heat treatment is performed, to generate gaseous DHF, so that the oxide of silicon can be etched. The process may be cyclically performed for multiple times, and has better isotropy than that of the SiCoNi process). The groove 55 on which enlargement treatment has been performed is separated from the first electrode 561. That is, the groove 55 on which enlargement treatment has been performed does not expose the first electrode 561. The enlargement treatment can further increase the size of the groove (for example, the size of the groove may be enlarged by 2 nm to 10 nm). This helps to increase the size of the electrode subsequently formed.

Thereafter, as shown in FIG. 5N, a second electrode 562 is epitaxially grown in the groove 55. The second electrode may fill the groove to be full, and may epitaxially grow out of the groove. For example, the second electrode 562 may be a second source or a second drain. For example, when the second semiconductor fin is used to form an NMOS device, the material of the second electrode may include SiP. In some implementations, in the process of epitaxially growing the second electrode, the manufacturing method may further include: doping the second electrode.

Optionally, before the second electrode is epitaxially grown, the manufacturing method may further include: performing pre-clean treatment on the semiconductor structure shown in FIG. 5M. Optionally, after the second electrode is epitaxially grown, the manufacturing method may further include: performing oxidation treatment to form a surface insulator layer (not shown, which may be, for example, an oxide of silicon) on a surface of the second electrode.

Thereafter, optionally, as shown in FIG. 5O, a second interlayer dielectric layer 532 is formed, by using, for example, a deposition process, on the semiconductor structure (for example, the semiconductor structure shown in FIG. 5N) on which the second electrode has been epitaxially grown. For example, the material of the second interlayer dielectric layer 532 may include silicon dioxide. The first interlayer dielectric layer 531 and the second interlayer dielectric layer 532 may together act as an interlayer dielectric layer.

Optionally, before the second interlayer dielectric layer is formed, the manufacturing method may further include: depositing a CESL layer on the semiconductor structure shown in FIG. 5N.

Thereafter, optionally, annealing treatment is performed on the semiconductor structure (for example, the semiconductor structure shown in FIG. 5O) on which the second interlayer dielectric layer has been formed. The annealing treatment may be used to activate impurities doped in the first electrode and the second electrode.

Thereafter, optionally, planarization treatment (for example, CMP) is performed on the semiconductor structure on which the annealing treatment has been performed. For example, planarization treatment is performed on the second interlayer dielectric layer 532.

In implementations described above, a manufacturing method for a semiconductor device is provided. In the foregoing manufacturing method, not only the size of an electrode (that is, an epitaxial body) is increased, reducing a contact resistance, and improving the performance of a device, but also electrodes on two fins are separated (that is, disconnected), thereby addressing a problem in the prior art that electrode epitaxial bodies of different devices are connected.

Further, when one of the first fin and the second fin is used to form a PMOS transistor and the other is used to form an NMOS transistor, the problem that source/drain epitaxial bodies of the PMOS transistor and the NMOS transistor in a SRAM are connected can be resolved, thereby resolving the problem that Vdd and Vss are bridged.

In addition, in forms of the foregoing method, a second electrode is epitaxially grown after a first interlayer dielectric layer is formed by deposition. That is, the second electrode has not been epitaxially grown when the first interlayer dielectric layer is deposited. Therefore, it is easy to fill a gap between a first electrode and the second electrode, thereby addressing a problem of filling of an interlayer dielectric layer between two electrode epitaxial bodies in the prior art. Because the problem of filling of the interlayer dielectric layer is addressed, there is no gap between the electrodes, and electrodes of different devices may not be connected in a process of forming a contactor.

Further, in forms of the foregoing manufacturing method, a self-aligning process can be applied when a groove is formed. This helps to subsequently epitaxially grow an electrode, and to improve the quality of the electrode.

Based on forms of the foregoing manufacturing method, other implementations of a semiconductor device are formed. For example, as shown in FIG. 5O, the semiconductor device may include: the substrate 501; the first semiconductor fin 511 and the second semiconductor fin 521 spaced on the substrate 501; and the first electrode 561 on the first semiconductor fin 511. The first electrode may be a first source or a first drain. The semiconductor device may further include: the first interlayer dielectric layer 531 on the substrate 501 and covering the first semiconductor fin 511, the second semiconductor fin 521, and the first electrode 561, where the groove 55 exposing the second semiconductor fin 521 is formed on the first interlayer dielectric layer 531, and the groove is separated from the first electrode 561. The semiconductor device may further include: a second electrode 562 on the second semiconductor fin 521 and epitaxially growing in the groove 55. The second electrode may be a second source or a second drain.

In this implementation, other forms of a semiconductor device are provided. In the semiconductor device, a first electrode on a first semiconductor fin and a second electrode on a second semiconductor fin are separated by a first interlayer dielectric layer, thereby addressing a problem in the prior art that electrode epitaxial bodies of different devices are connected. Moreover, there is no problem of gap filling in the first interlayer dielectric layer.

Further, when one of the first semiconductor fin or the second semiconductor fin is used to form a PMOS transistor and the other is used to form an NMOS transistor, a problem that source/drain epitaxial bodies of the PMOS transistor and the NMOS transistor in a SRAM are connected can be addressed, thereby resolving the problem that Vdd and Vss are bridged.

In addition, because the second electrode in the semiconductor device is formed by epitaxial growing in a groove, the shape of the second electrode is affected by the shape of the groove, and is different from the shape of an epitaxial body electrode in the prior art.

Optionally, as shown in FIG. 5O, the semiconductor device may further include: the trench 502 around the first semiconductor fin 511 and the second semiconductor fin 521, and the trench insulator layer 503 partially filling the trench.

Optionally, as shown in FIG. 5O, the semiconductor device may further include: the first separating coverage layer 5041 on the first semiconductor fin 511, the second semiconductor fin 521, and the trench insulator layer 503.

Optionally, as shown in FIG. 5O, the semiconductor device may further include: the surface insulator layer 508 on the surface of the first electrode 561.

Optionally, as shown in FIG. 5O, the semiconductor device may further include: a second separating coverage layer 5042 on the trench insulator layer 503, the surface insulator layer 508, and the first separating coverage layer 5041, where the first interlayer dielectric layer 531 is formed on the second separating coverage layer 5042.

Optionally, as shown in FIG. 5O, the semiconductor device may further include: the second interlayer dielectric layer 532 on the first interlayer dielectric layer 531 and the second electrode 562.

Figure 6:
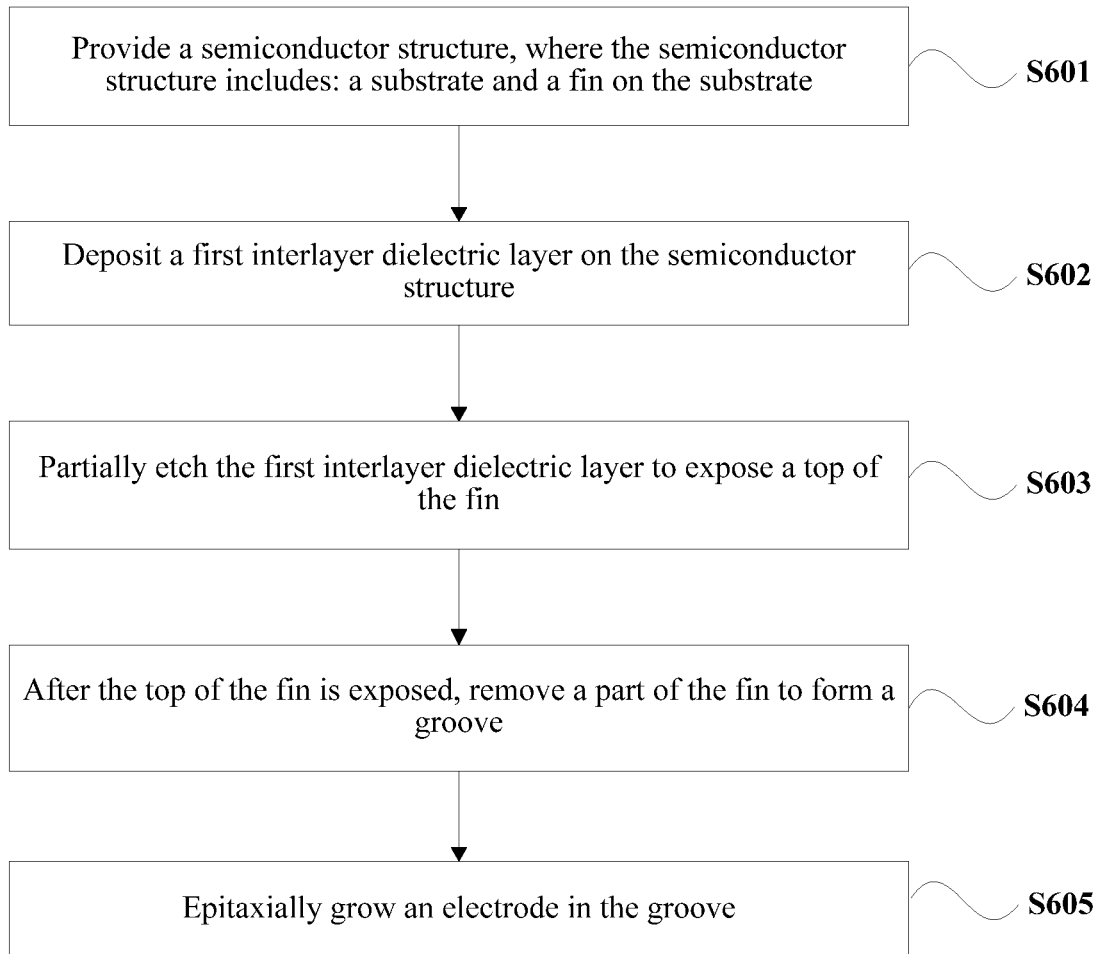
FIG. 6 is a flowchart showing a manufacturing method for a semiconductor device according to another form of the present disclosure.

FIG. 6 is a flowchart showing another form of a manufacturing method for a semiconductor device.

In step S601, a semiconductor structure is provided, where the semiconductor structure includes: a substrate and a fin on the substrate.

In step S602, a first interlayer dielectric layer is deposited on the semiconductor structure.

In step S603, the first interlayer dielectric layer is partially etched to expose a top of the fin.

In step S604, after the top of the fin is exposed, a part of the fin is removed to form a groove.

In step S605, an electrode is epitaxially grown in the groove. For example, the electrode may be a source or a drain.

In this implementation, other forms of a manufacturing method are provided. In the manufacturing method, a first interlayer dielectric layer is deposited on a semiconductor structure, then the first interlayer dielectric layer is etched to expose a top of a fin, a groove is obtained by removing a part of the fin, and an electrode is epitaxially grown in the groove. This method helps to separate the electrode on the fin from another electrode without reducing the size of the electrode (that is, an epitaxial body), thereby resolving the problem in the prior art that electrode epitaxial bodies of different devices are connected.

FIG. 7A to FIG. 7I are cross-section views schematically showing structures at several stages of a manufacturing process of a semiconductor device. Forms of a manufacturing process of a semiconductor device according to some forms of the present disclosure are described in detail below with reference to FIG. 7A to FIG. 7I.

Figure 7A:
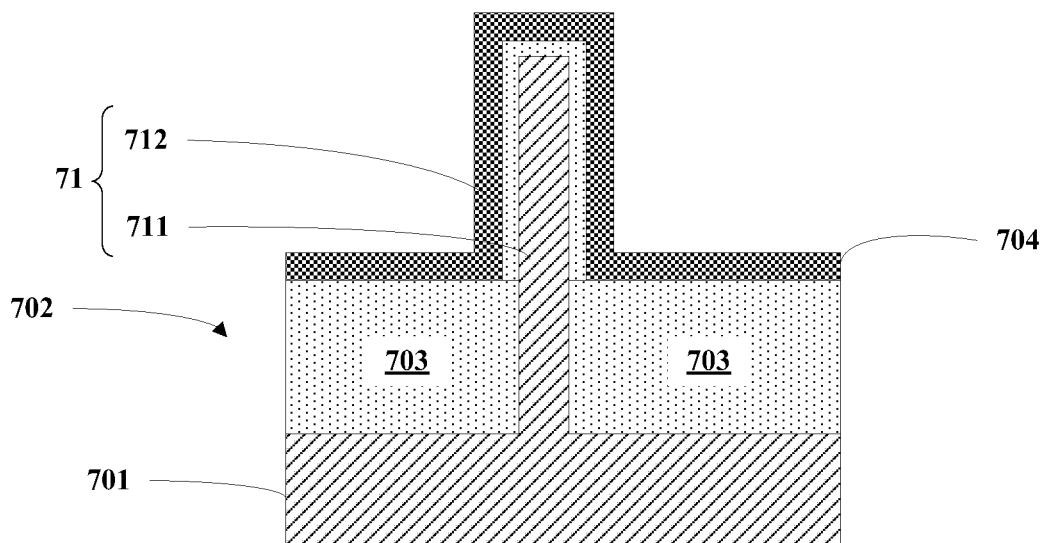
FIG. 7A to FIG. 7I are cross-sectional views schematically showing structures at several stages of a manufacturing process of a semiconductor device.

First, as shown in FIG. 7A, a semiconductor structure is provided. The semiconductor structure may include: a substrate (for example, a silicon substrate) 701 and a fin 71 on the substrate 701. For example, the fin 71 may include: a semiconductor fin (for example, silicon) 711 on the substrate 701 and a first insulator layer (for example, silicon dioxide) 712 on a surface of the semiconductor fin 711. In another implementation, the fin 71 may include only the semiconductor fin 711 but does not include the first insulator layer 712. Therefore, the scope of the present disclosure is not limited to only the structure form of the fin disclosed herein.

In the step of providing the semiconductor structure, as shown in FIG. 7A, the semiconductor structure may further include: a trench 702 around the fin 71; and a trench insulator layer (for example, silicon dioxide) 703 partially filling the trench 702. The semiconductor structure may further include: a separating coverage layer (for example, silicon nitride) 704 covering the fin 71 and the trench insulator layer 703.

Figure 7B:
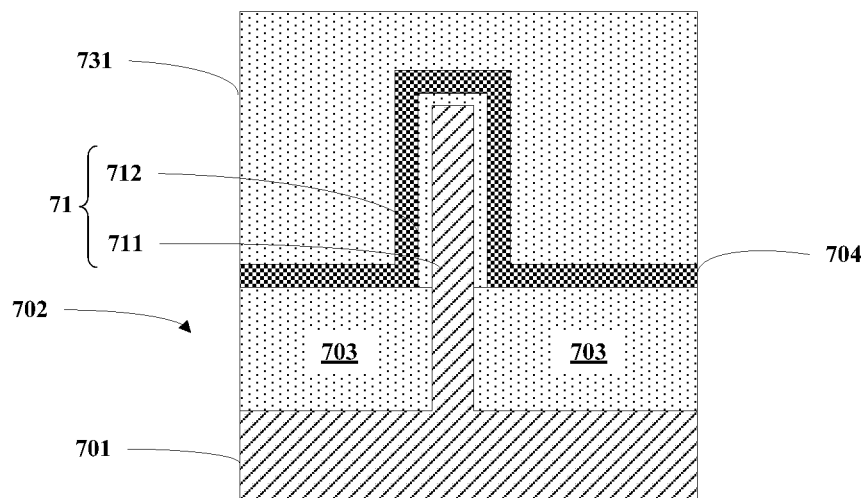

Thereafter, as shown in FIG. 7B, a first interlayer dielectric layer (for example, silicon dioxide) 731 is deposited on the semiconductor structure shown in FIG. 7A. The first interlayer dielectric layer may be formed on the separating coverage layer 704. Optionally, the manufacturing method may further include: performing planarization treatment on the first interlayer dielectric layer.

Thereafter, the first interlayer dielectric layer is partially etched to expose a top of the fin. This process is described in detail below with reference to FIG. 7C and FIG. 7D.

Figure 7C:
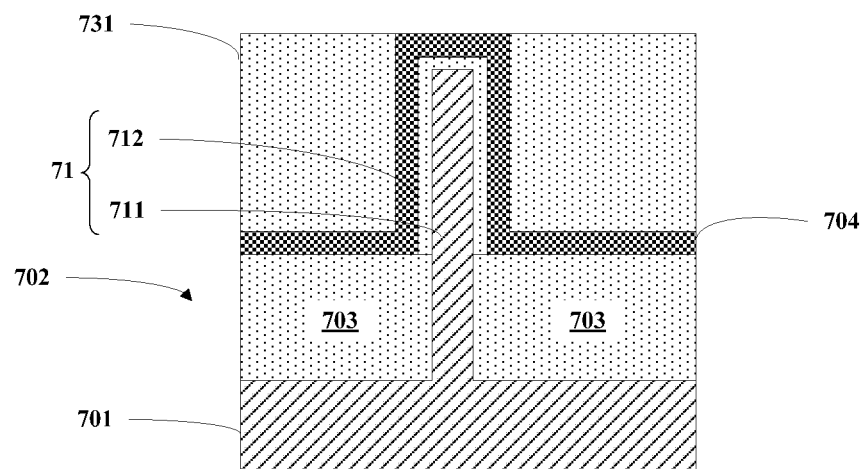

For example, as shown in FIG. 7C, the first interlayer dielectric layer 731 is partially etched by using the separating coverage layer 704 as an etch stop layer, to expose a part of the separating coverage layer 704 on the top of the fin 71.

Figure 7D:
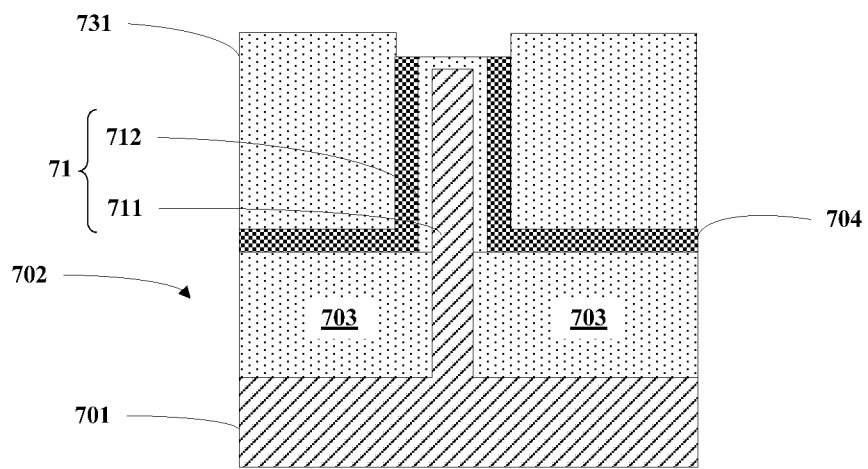

Then, as shown in FIG. 7D, the exposed part of the separating coverage layer 704 on the top of the fin 71 is removed, to expose the top of the fin 71, for example, expose a top of the first insulator layer 712.

Thereafter, a part of the fin is removed to form a groove. Optionally, this step may include: removing the part of the fin and a part of the separating coverage layer on a side wall of the removed part of the fin, to form the groove. This process is described in detail below with reference to FIG. 7E and FIG. 7F.

Figure 7E:
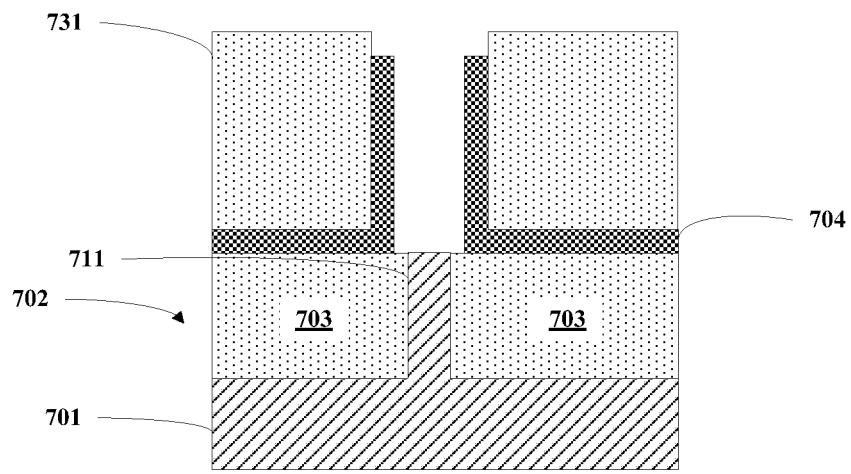

For example, as shown in FIG. 7E, after the top of the fin is exposed, the part of the fin 71 is removed by using, for example, an etching process, to expose the part of the separating coverage layer 704 on the side wall of the removed part of the fin. For example, a part of the semiconductor fin 711 and a part of the first insulator layer 712 on the surface of the semiconductor fin 711 are removed.

Thereafter, preferably, a top insulator layer (for example, silicon dioxide) is formed on a top of a remaining part of the fin 71 (for example, the semiconductor fin 711) using, for example, an oxidation process. This helps to protect the top of the semiconductor fin in the subsequent process of removing the part of the separating coverage layer 704.

Figure 7F:
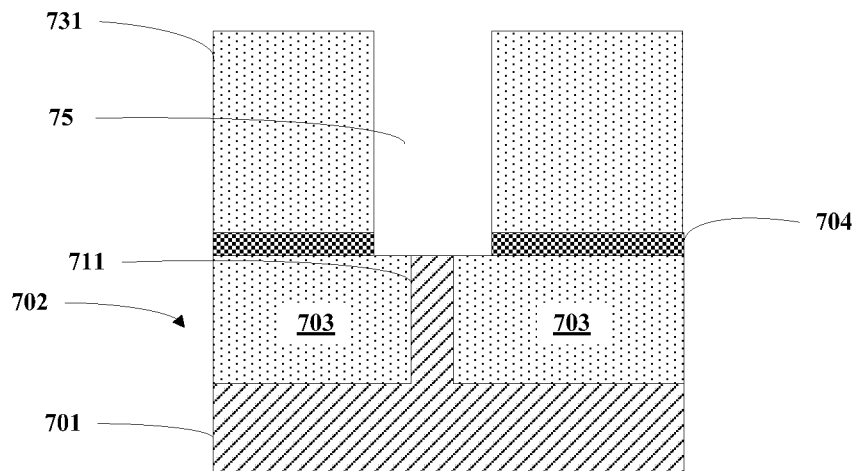

Thereafter, as shown in FIG. 7F, the exposed part of the first separating coverage layer 704 on the side wall of the removed part of the fin is removed, to form a groove 75.

Figure 7G:
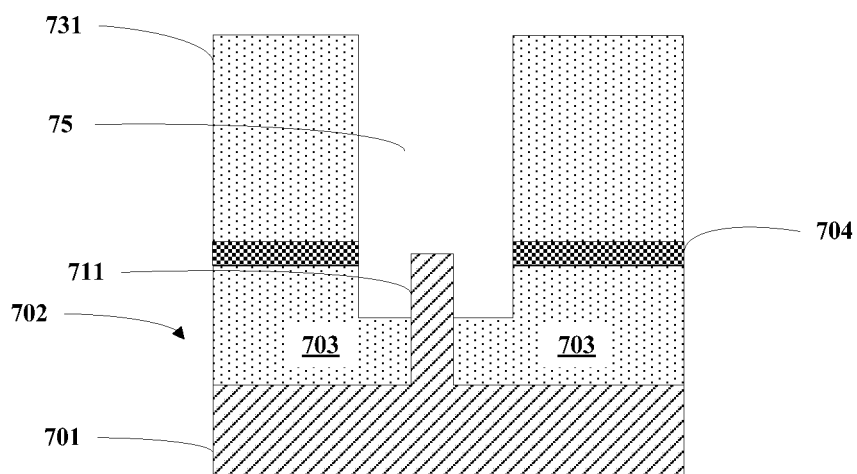

Thereafter, optionally, as shown in FIG. 7G, enlargement treatment is performed on the groove 75 by using an etching process.

Figure 7H:
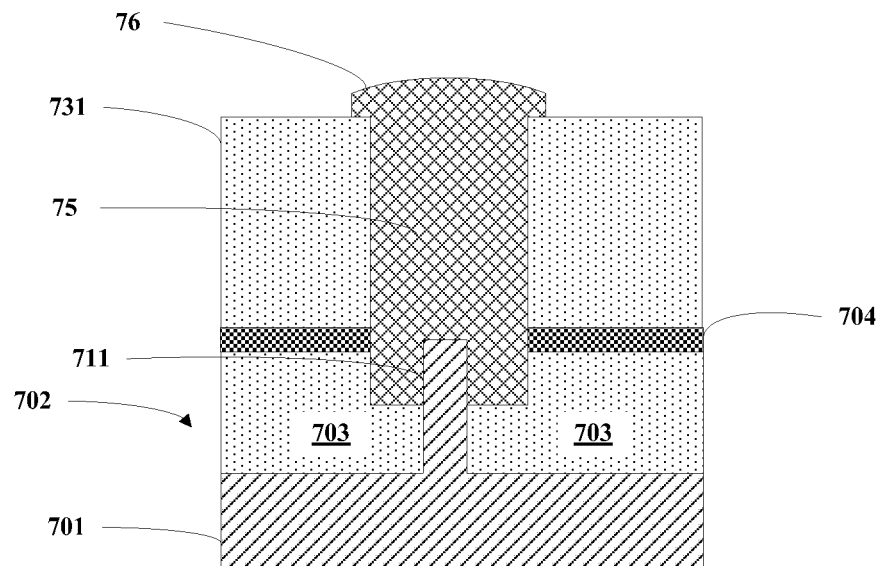

Thereafter, as shown in FIG. 7H, an electrode 76 is epitaxially grown in the groove 75 on which enlargement treatment has been performed. The electrode may fill the groove to be full, and may epitaxially grow out of the groove. For example, the electrode 76 may be a source or a drain. For example, the material of the electrode may include SiGe or SiP. In some implementations, in the process of epitaxially growing the electrode, the manufacturing method may further include: doping the electrode.

Figure 7I:
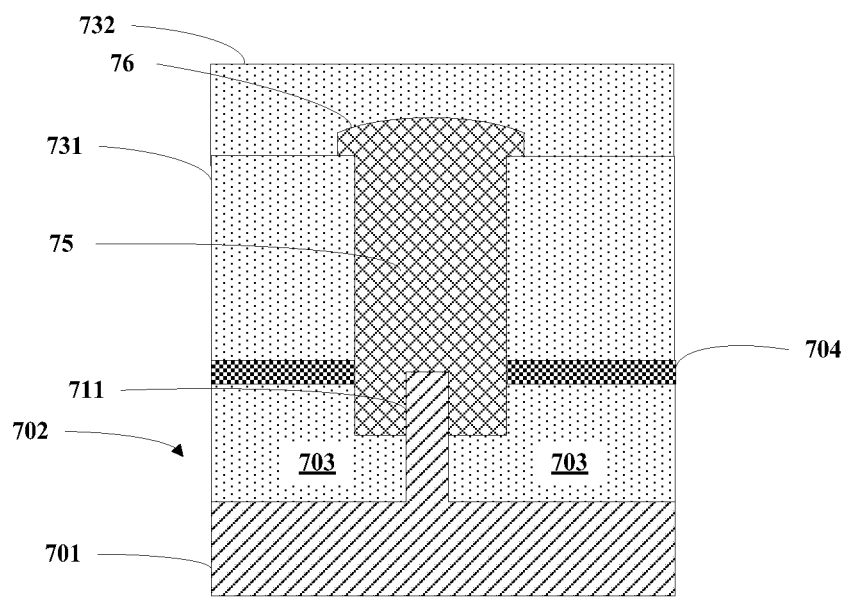

Thereafter, optionally, as shown in FIG. 7I, a second interlayer dielectric layer 732 is formed, by using, for example, a deposition process, on the semiconductor structure (for example, the semiconductor structure shown in FIG. 7H) on which the electrode has been epitaxially grown. For example, the material of the second interlayer dielectric layer 732 may include silicon dioxide.

Thereafter, optionally, annealing treatment is performed on the semiconductor structure (for example, the semiconductor structure shown in FIG. 7I) on which the second interlayer dielectric layer has been formed. The annealing treatment may be used to activate impurities doped in the electrode.

Thereafter, optionally, planarization treatment (for example, CMP) is performed on the semiconductor structure on which the annealing treatment has been performed. For example, planarization treatment is performed on the second interlayer dielectric layer 732.

In the foregoing implementation, other forms of a manufacturing method for a semiconductor device are provided. In forms of the foregoing manufacturing method, not only the size of an electrode (that is, an epitaxial body) is increased, improving the performance of a device, but also an electrode on a fin is separated (that is, disconnected) from another electrode (not shown), thereby addressing a problem in the prior art that electrode epitaxial bodies of different devices are connected.

Based on forms of the foregoing manufacturing method, other forms of a semiconductor device are further formed. For example, as shown in FIG. 7I, the semiconductor device may further include: a substrate 701; a semiconductor fin 711 on the substrate 701; a first interlayer dielectric layer 731 on the substrate 701 and covering the semiconductor fin 711, where a groove 75 exposing the semiconductor fin 711 is formed on the first interlayer dielectric layer 731; and an electrode 76 on the semiconductor fin 711 and epitaxially growing in the groove 75. For example, the electrode may be a source or a drain.

In this implementation, forms of a semiconductor device are provided. In the semiconductor device, an electrode on a semiconductor fin is surrounded by a first interlayer dielectric layer, and thereby can be separated from another electrode (not shown). This can address a problem in the prior art that electrode epitaxial bodies of different devices are connected.

In addition, because the electrode in the semiconductor device is formed by epitaxial growing in a groove, the shape of the electrode is affected by the shape of the groove, and is different from the shape of an epitaxial body electrode in the prior art.

Optionally, as shown in FIG. 7I, the semiconductor device may further include: the trench 702 around the semiconductor fin 711, and the trench insulator layer 703 partially filling the trench.

Optionally, as shown in FIG. 7I, the semiconductor device may further include: the separating coverage layer 704 covering the trench insulator layer 703, where the first interlayer dielectric layer 731 is formed on the separating coverage layer 704.

Optionally, as shown in FIG. 7I, the semiconductor device may further include: the second interlayer dielectric layer 732 on the first interlayer dielectric layer 731 and the electrode 76.

The present disclosure has been described in detail hereto. To avoid obscuring the concepts of the present disclosure, some details well known in the field are not described. A person skilled in the art can understand, according to the descriptions above, how to implement the technical solutions disclosed herein.

Although some particular embodiments and implementations of the present disclosure have been described in detail using examples, a person skilled in the art should understand that the foregoing examples are merely for purpose of illustration, rather than to limit the scope of the present disclosure. A person skilled in the art should understand that the foregoing embodiments and implementations can be modified without departing from the scope and spirit of the present disclosure. The scope of the present disclosure shall be subject to the accompanying claims.

What is claimed is:

1. A manufacturing method for a semiconductor device, comprising:
   providing a semiconductor structure, wherein the semiconductor structure comprises:
   a substrate, and
   a first fin and a second fin positioned on the substrate;
   depositing a first interlayer dielectric layer on the semiconductor structure;
   performing first partial etching on the first interlayer dielectric layer to expose a top of the first fin;
   after the top of the first fin is exposed, removing a part of the first fin to form a first groove;
   epitaxially growing a first electrode in the first groove;
   performing second partial etching on the first interlayer dielectric layer to expose a top of the second fin;
   after the top of the second fin is exposed, removing a part of the second fin to form a second groove, wherein the second groove is separated from the first groove; and
   epitaxially growing a second electrode in the second groove.

2. The method according to claim 1, wherein:
   the method further comprises performing an enlargement treatment on the first groove before epitaxially growing the first electrode;
   the step of epitaxially growing a first electrode in the first groove comprises: epitaxially growing the first electrode in the first groove on which enlargement treatment has been performed;
   the method further comprises performing an enlargement treatment on the second groove before the epitaxially growing a second electrode, wherein the second groove on which the enlargement treatment has been performed is separated from the first electrode; and
   the step of epitaxially growing a second electrode in the second groove comprises: epitaxially growing the second electrode in the second groove on which enlargement treatment has been performed.

3. The method according to claim 1, wherein:
   in the step of providing a semiconductor structure, the semiconductor structure further comprises:
   a trench around the first fin and the second fin;
   a trench insulator layer partially filling the trench; and
   a separating coverage layer covering the first fin, the second fin, and the trench insulator layer, wherein the first interlayer dielectric layer is formed on the separating coverage layer.

4. The method according to claim 3, wherein:
   the step of performing first partial etching on the first interlayer dielectric layer to expose a top of the first fin comprises:
   performing first partial etching on the first interlayer dielectric layer using the separating coverage layer as an etch stop layer, to expose a part of the separating coverage layer on the top of the first fin; and
   removing the exposed part of the separating coverage layer on the top of the first fin, to expose the top of the first fin; and
   the step of removing a part of the first fin to form a first groove comprises:
   removing the part of the first fin and a part of the separating coverage layer on a side wall of the removed part of the first fin, to form the first groove.

5. The method according to claim 3, wherein the method further comprises:
   before performing the second partial etching on the first interlayer dielectric layer, depositing a cover layer on the semiconductor structure on which the first electrode has been epitaxially grown.

6. The method according to claim 5, wherein
   the step of performing second partial etching on the first interlayer dielectric layer to expose a top of the second fin comprises:
   performing second partial etching on the first interlayer dielectric layer and the cover layer using the separating coverage layer as an etch stop layer, to expose a part of the separating coverage layer on the top of the second fin; and
   removing the exposed part of the separating coverage layer on the top of the second fin, to expose the top of the second fin; and
   the step of removing a part of the second fin to form a second groove comprises:
   removing the part of the second fin and a part of the separating coverage layer on a side wall of the removed part of the second fin, to form the second groove.

7. The method according to claim 1, wherein
   the first fin comprises:
   a first semiconductor fin on the substrate and
   a first insulator layer on a surface of the first semiconductor fin;
   the second fin comprises:
   a second semiconductor fin on the substrate and
   a second insulator layer on a surface of the second semiconductor fin;
   the first electrode is a first source or a first drain; and
   the second electrode is a second source or a second drain.

8. The method according to claim 1, further comprising:
   forming a second interlayer dielectric layer on the semiconductor structure on which the second electrode has been epitaxially grown;
   performing annealing treatment on the semiconductor structure on which the second interlayer dielectric layer has been formed; and performing planarization treatment on the semiconductor structure on which the annealing treatment has been performed.

9. A manufacturing method for a semiconductor device, comprising:
providing a semiconductor structure, wherein the semiconductor structure comprises:
a substrate;
a first fin and a second fin spaced on the substrate; and
a first electrode on the first fin;
depositing a first interlayer dielectric layer on the semiconductor structure such that the first fin, the second fin, and the first electrode are embedded in the first interlayer dielectric layer;
partially etching the first interlayer dielectric layer to expose a top of the second fin;
after the top of the second fin is exposed, removing a part of the second fin to form a groove, wherein the groove is separated from the first electrode; and
epitaxially growing a second electrode in the groove.

10. The method according to claim 9, wherein:
the method further comprises: before epitaxially growing the second electrode, performing enlargement treatment on the groove, wherein the groove on which enlargement treatment has been performed is separated from the first electrode; and
the step of epitaxially growing a second electrode in the groove comprises: epitaxially growing the second electrode in the groove on which enlargement treatment has been performed.

11. The method according to claim 9, wherein:
in the step of providing a semiconductor structure, the semiconductor structure further comprises:
a trench around the first fin and the second fin;
a trench insulator layer partially filling the trench; and
a first separating coverage layer covering the first fin, the second fin, and a part of the trench insulator layer;
before depositing a first interlayer dielectric layer, the method further comprises:
performing oxidization treatment to form a surface insulator layer on a surface of the first electrode; and
forming a second separating coverage layer on the trench insulator layer, the surface insulator layer, and the first separating coverage layer; and
the first interlayer dielectric layer is deposited on the second separating coverage layer.

12. The method according to claim 11, wherein:
the step of partially etching the first interlayer dielectric layer to expose a top of the second fin comprises:
partially etching the first interlayer dielectric layer using the second separating coverage layer as an etch stop layer, to expose a part of the second separating coverage layer on the top of the second fin; and
removing the exposed part of the second separating coverage layer and an exposed part of the first separating coverage layer that are on the top of the second fin, to expose the top of the second fin; and
the step of removing a part of the second fin to form a groove comprises:
removing the part of the second fin, and a part of the first separating coverage layer and a part of the second separating coverage layer that are on a side wall of the removed part of the second fin, to form the groove.

13. The method according to claim 12, wherein:
the step of removing the part of the second fin, and a part of the first separating coverage layer and a part of the second separating coverage layer that are on a side wall of the removed part of the second fin, to form the groove comprises:
removing the part of the second fin to expose the part of the first separating coverage layer and the part of the second separating coverage layer that are on the side wall of the removed part of the second fin;
forming a top insulator layer on a top of a remaining part of the second fin; and
after the top insulator layer is formed, removing the exposed part of the first separating coverage layer and the exposed part of the second separating coverage layer.

14. The method according to claim 11, wherein:
the first fin comprises:
a first semiconductor fin on the substrate and
a first insulator layer on a surface of the first semiconductor fin;
the second fin comprises:
a second semiconductor fin on the substrate and
a second insulator layer on a surface of the second semiconductor fin;
the first electrode is a first source or a first drain; and
the second electrode is a second source or a second drain.

15. The method according to claim 14, wherein the step of providing a semiconductor structure comprises:
providing an initial structure, wherein the initial structure comprises:
the substrate; and
the first semiconductor fin and the second semiconductor fin spaced on the substrate;
forming the first insulator layer on the surface of the first semiconductor fin and forming the second insulator layer on the surface of the second semiconductor fin;
forming, on the first insulator layer, a first pseudo grid surrounding the first semiconductor fin, and forming, on the second insulator layer, a second pseudo grid surrounding the second semiconductor fin;
forming the first separating coverage layer on the initial structure on which the first pseudo grid and the second pseudo grid have been formed;
etching the first semiconductor fin, and the part of the first insulator layer and the part of the first separating coverage layer that are on the first semiconductor fin, to form the groove; and
epitaxially growing the first electrode in the groove.

16. The method according to claim 9, further comprising:
forming a second interlayer dielectric layer on the semiconductor structure on which the second electrode has been epitaxially grown;
performing annealing treatment on the semiconductor structure on which the second interlayer dielectric layer has been formed; and
performing planarization treatment on the semiconductor structure on which the annealing treatment has been performed.

17. A manufacturing method for a semiconductor device, comprising:
providing a semiconductor structure, wherein the semiconductor structure comprises: a substrate and a fin on the substrate;
depositing a first interlayer dielectric layer on the semiconductor structure;
partially etching the first interlayer dielectric layer to expose a top of the fin;
after the top of the fin is exposed, removing a part of the fin to form a groove;

performing enlargement treatment on the groove; and after performing the enlargement treatment, epitaxially growing an electrode in the groove on which the enlargement treatment has been performed.

18. The method according to claim 17, wherein:

in the step of providing a semiconductor structure, the semiconductor structure further comprises:

a trench around the fin;

a trench insulator layer partially filling the trench; and a separating coverage layer covering the fin and the trench insulator layer;

the step of partially etching the first interlayer dielectric layer to expose a top of the fin comprises:

partially etching the first interlayer dielectric layer using the separating coverage layer as an etch stop layer, to expose a part of the separating coverage layer on the top of the fin; and removing the exposed part of the separating coverage layer on the top of the fin, to expose the top of the fin; and the step of removing a part of the fin to form a groove comprises:

removing the part of the fin and a part of the separating coverage layer on a side wall of the removed part of the fin, to form the groove.

19. The method according to claim 17, wherein:

the fin comprises:

a semiconductor fin on the substrate and a first insulator layer on a surface of the semiconductor fin; and the electrode is a source or a drain.

20. The method according to claim 17, further comprising:

forming a second interlayer dielectric layer on the semiconductor structure on which the electrode has been epitaxially grown;

performing annealing treatment on the semiconductor structure on which the second interlayer dielectric layer has been formed; and performing planarization treatment on the semiconductor structure on which the annealing treatment has been performed.

* * * * *